United States Patent
Shimada

(10) Patent No.: US 7,642,859 B2
(45) Date of Patent: Jan. 5, 2010

(54) POWER AMPLIFIER

(75) Inventor: Masayuki Shimada, Tokyo (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 11/859,313

(22) Filed: Sep. 21, 2007

(65) Prior Publication Data

US 2008/0079487 A1 Apr. 3, 2008

(30) Foreign Application Priority Data

Sep. 29, 2006 (JP) .............................. 2006-266300

(51) Int. Cl.
*H03F 3/191* (2006.01)
(52) U.S. Cl. ...................... 330/302; 330/310; 330/126; 330/51
(58) Field of Classification Search ................. 330/302, 330/310, 126, 51
See application file for complete search history.

(56) References Cited

U.S. PATENT DOCUMENTS 5,774,017 A * 6/1998 Adar ........................... 330/51
6,081,694 A * 6/2000 Matsuura et al. ............... 455/78
6,121,840 A * 9/2000 Sakusabe ..................... 330/277
7,385,450 B2 * 6/2008 Fukuda et al. ............... 330/296
7,417,508 B1 * 8/2008 Quaglietta ................... 330/302

FOREIGN PATENT DOCUMENTS

JP 11-261479 9/1999

* cited by examiner

*Primary Examiner*—Patricia Nguyen
(74) *Attorney, Agent, or Firm*—Oblon, Spivak, McClelland, Maier & Neustadt, L.L.P.

(57) ABSTRACT

A power amplifier includes an amplification circuit, an input stage matching circuit, and an output stage matching circuit. The amplification circuit amplifies an input signal in each frequency band by an active element common to the signals in plural types of frequency bans, and outputs the amplified signal. The input stage matching circuit is disposed on an input side of the active element, and performs an impedance-matching between an output impedance of a circuit which supplies the signals of the plural types of frequency bands and an input impedance of the active element. The output stage matching circuit is disposed on an output side of the active element, and performs an impedance-matching between an input impedance of a circuit which receives the signals of the plural types of frequency bands outputted from the active element and an output impedance of the active element.

14 Claims, 11 Drawing Sheets

FIG. 1A
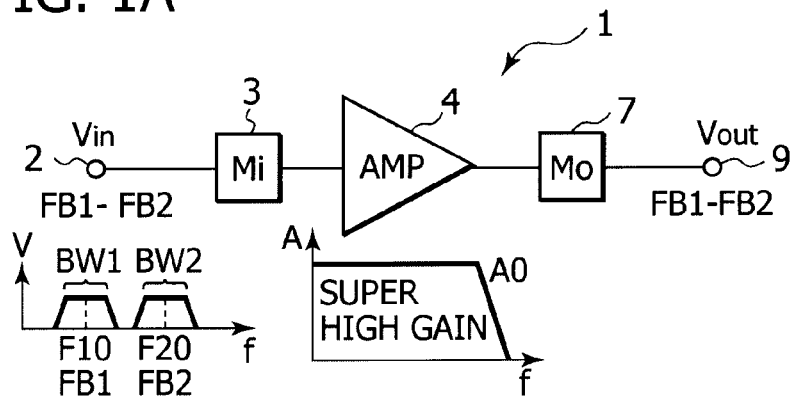
FIG. 1B
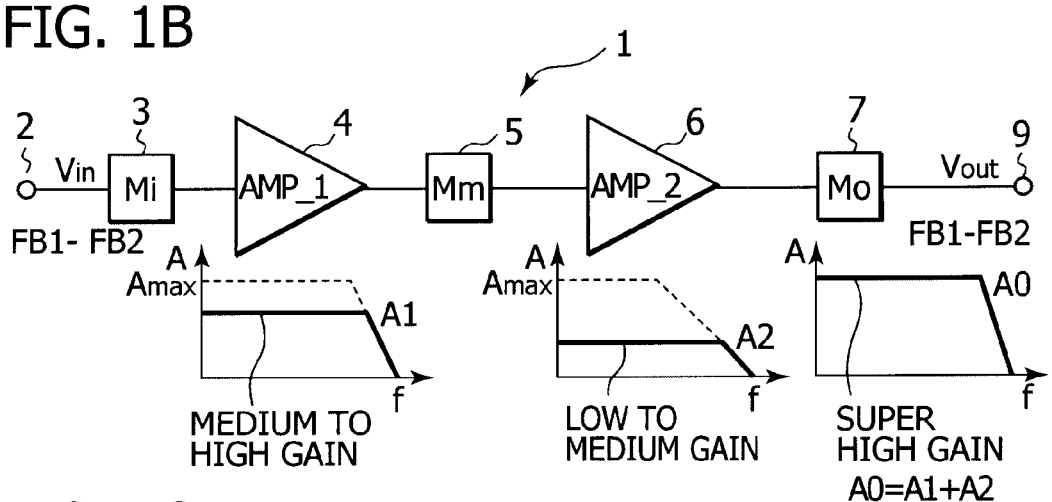
FIG. 1C
(C1)
INPUT STAGE MATCHING
CIRCUITS Mi, Mm
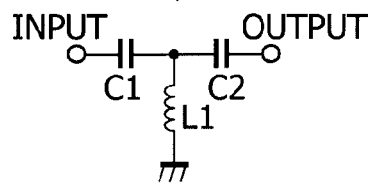
(C2)
INPUT STAGE MATCHING
CIRCUITS Mi, Mm
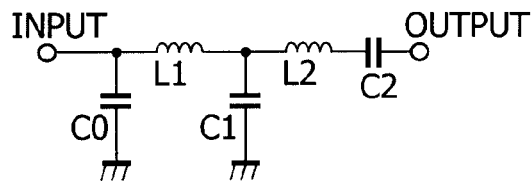
(C3)
OUTPUT STAGE MATCHING CIRCUIT Mo
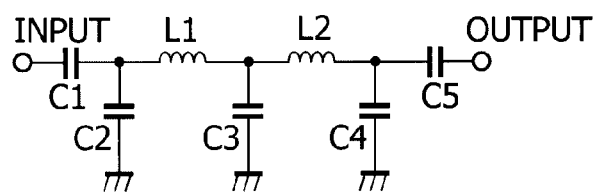

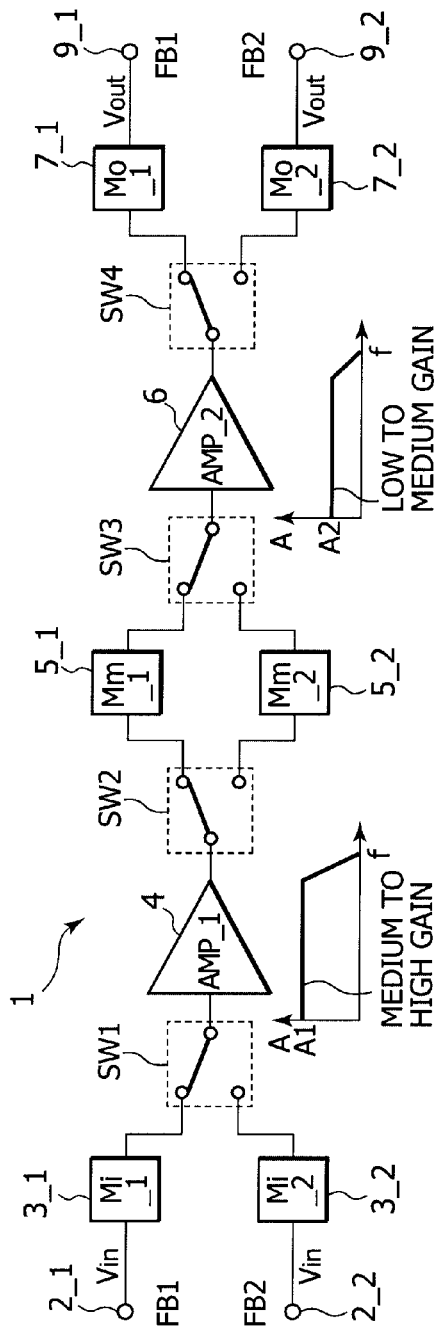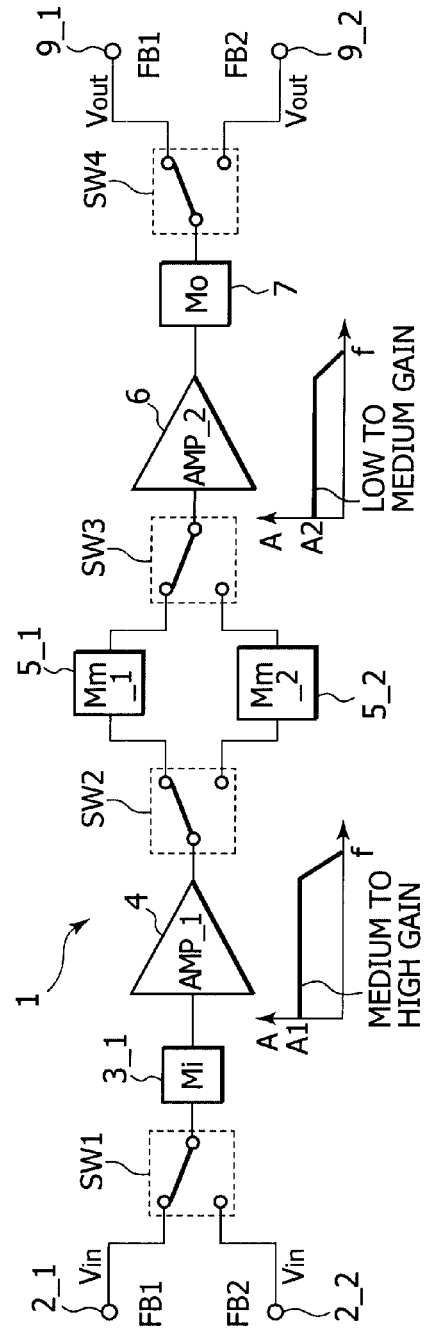

POWER AMPLIFIER

BACKGROUND OF THE INVENTION

1. Field of the Invention

The present invention relates to a power amplifier (power amplification circuit), and, for example, relates to a power amplifier suitable for use in a transmission power amplifier applied to communication terminal apparatuses, such as a mobile phone of a CDMA system etc.

2. Description of Related Art

The number of mobile phone subscribers in Japan of today is approximately 80% of the population. Among those, the number of owners of mobile communications terminal apparatuses using a CDMA (Code Division Multiple Access) technology reaches approximately 50%. As to demand for the terminals in the future, it is considered that the demand for mobile communications terminal apparatuses further increases as PDC (Personal Digital Cellular) terminal apparatuses etc. are replaced with mobile communications terminal apparatuses of a W-CDMA (Wideband-CDMA) system.

In communication terminal apparatuses including the mobile communications terminal apparatus, in order to generate a transmission wave, the electric power amplification circuit (also referred to as power amplifier, particularly transmission power amplifying circuit) is provided (see Japanese Unexamined Patent Application Publication No. H11-261479, for example). This electric power amplification circuit is arranged such that the frequency band corresponds to a frequency band of the transmission wave.

On the other hand, as the demand for the mobile communications terminal apparatuses increases and the number of applications for terminal apparatus increases, carrier frequencies are to be reorganized in order to increase information communicating capability of mobile communications.

As the mobile communications carrier frequencies are reorganized, it is necessary for each terminal apparatus to install a system corresponding to a new frequency. Further, due to the influence of the increasing applications, the terminals increase in size. The miniaturization of the inner components of the terminal apparatus is required to prevent the size from increasing.

For this reason, the recent trend of power amplifiers of manufactures is mainly to perform miniaturization. Consequently, the manufactures work on the development of a size reduction of the power amplifier corresponding to each frequency to be reorganized.

SUMMARY OF THE INVENTION

However, there are physical limits to miniaturization of the power amplifier in these days. For the further convenience of the mobile communications terminal apparatus, a situation arises in which a problem may not be solved only by miniaturizing components in view of addition of application, portability, etc.

Furthermore, if the system corresponding to a carrier frequency band which is reorganized and newly added is attached to an existing terminal apparatus as it is, an individual electric power amplifier suited for each carrier frequency (for each frequency band) is provided. But, then, it inevitably leads to the increase in price, and it is difficult to cope with the needs of an end user. As a result, a situation inevitably arises in which a unit price of a component should be reduced.

In view of the above situations, the present invention is made and provides an arrangement in which electric power amplification of signals of plural types of frequency bands can be realized without using an electric power amplifier for each frequency band.

According to an embodiment of the present invention, there is provided a power amplifier which includes an amplification circuit includes an active element which amplifies a signal, and is configured to supply signals in plural types of frequency bands. The power amplifier amplifies an input signal in each frequency band by the active element common to the signals in the plural types of frequency bands, and outputs the amplified signals. That is, the active element for electric power amplification is used in common with respect to the signals of the plural types of frequency bands.

Further, in the power amplifier in an embodiment of the present invention, an input stage matching circuit for impedance-matching between an output impedance of a circuit which supplies the signals of the plural types of frequency bands and an input impedance of the active element is disposed on an input side of the active element.

Furthermore, an output stage matching circuit for impedance-matching between an input impedance of a circuit which receives the signals of the plural types of frequency bands outputted from the active element and an output impedance of the active element is disposed on an output side of the active element.

Further, the amplification circuits (i.e., active elements) may be provided in a cascade arrangement of a plural-stage structure when it is hard to realize an electric power amplification factor required to correspond to the plural types of frequency bands and to obtain certain, desired output electric power by one active element.

In the case of employing the plural-stage structure, an interstage matching circuit for impedance-matching between an output impedance of the active element at a former stage and an input impedance of an active element at a latter stage is provided at each interstage, with respect to the signals of the plural types of frequency bands.

By the active element for electric power amplification is used in common to the signals of the plural types of frequency bands, a problem may arise in the impedance matching of the active element to the signals of the plural types of frequency bands. Thus, the matching circuits for matching impedances are each provided on the input side and the output side, to cope with the problem. In the case of employing the plural-stage structure, the matching circuit may be also provided between the stages, to similarly cope with it.

Further, in the case of employing the plural-stage structure, the amplification circuit at the latter stage may be provided with a source grounding amplifier circuit where a source is grounded through the impedance element for negative feedback (for example, resistance element, or inductance element) having an impedance component with a predetermined magnitude, and that the interstage matching circuit is common to the signals of the plural types of frequency bands.

A path-selecting switch circuit may be provided as needed, and paths for passing the signals of the plural types of frequency bands may be provided for the respective frequency bands. Even in this case, since the active element for electric power amplification of each stage is used in common to the signals of the plural types of frequency bands, input and output with respect to the amplification circuit (i.e., active element) may be of a single-line for the signals of the plural types of frequency bands.

Further, when the paths through which the signals of the plural types of frequency bands are passed by means of the path-selecting switch circuit are provided for the respective frequency bands, the matching circuit suited for each frequency band may be used. In the case of employing the plural-stage structure, the interstage matching circuit suited for each frequency band may be used similarly.

Further, when the paths through which the signals of the plural types of frequency bands are passed by means of the path-selecting switch circuits are provided for the respective frequency bands, an isolation circuit may which is connected with a terminal on a side by band of the path-selecting switch circuit, may be provided. The isolation circuit operates a signal for passing through the corresponding terminal of the side by band when the path-selecting switch circuit does not select, and then passes the signal to a path different from an original signal path, while the isolation circuit makes the signal for passing through the corresponding terminal of the side by band become inoperative when the path-selecting switch circuit selects the signal. The isolation circuit may be arranged to have a terminating resistor for oscillation prevention.

The path-selecting switch circuit may be constituted by a junction-type pseudomorphic high-electron mobility transistor to cope with one-chip fabrication of the electric power amplification circuit, or operation by means of a single positive power supply.

According to an embodiment of the present invention, since the active element for electric power amplification is used in common to the signals of the plural types of frequency bands, the electric power amplification of the signals of the plural types of frequency bands can be realized without using the electric power amplifier for each frequency band.

Further, if the active element is common simply, a problem may arise in impedance matching of the active element with respect to the signals of the plural types of frequency bands. However, by providing the matching circuits for matching impedances on the input side and the output side respectively, it is possible to avoid the problem with the impedance mismatching.

BRIEF DESCRIPTION OF THE DRAWINGS

FIGS. 1A-1C are circuit block diagrams for explaining a first example of a basic structure.

FIGS. 3A and 3B are circuit block diagrams for explaining a third example of a basic structure.

DETAILED DESCRIPTION OF THE EMBODIMENTS

Figure 2A:
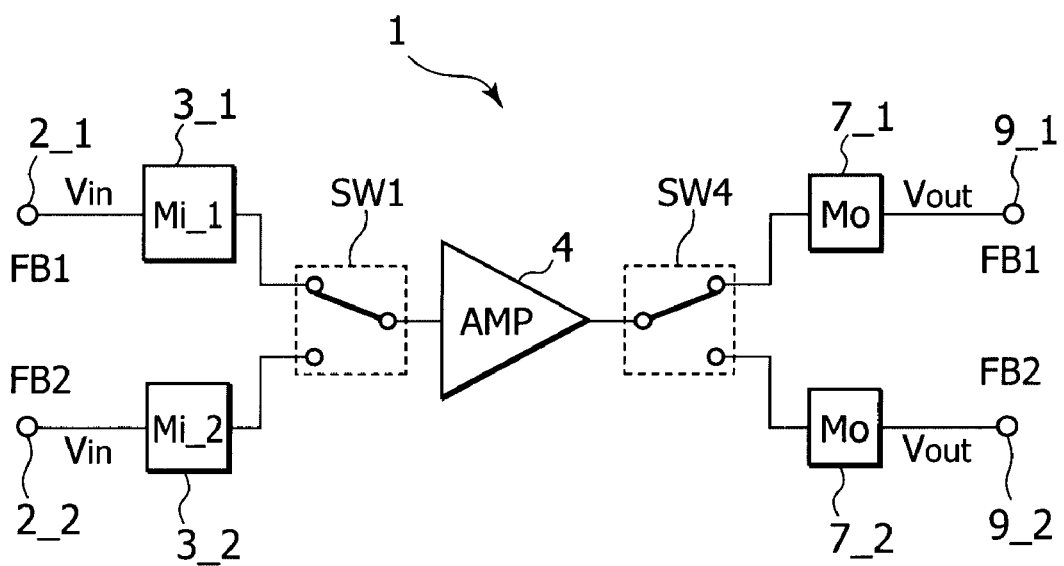
FIGS. 2A and 2B are circuit block diagrams for explaining a second example of a basic structure.

Hereafter, with reference to the drawings, embodiments of the present invention will be described in detail.

<<Basic Structure>>

FIGS. 1-4 are diagrams for explaining a basic structure of a transmission power amplifying circuit 1 which are embodiments of the power amplifier according to the present invention. In the embodiments, the transmission power amplifying circuit 1 according to an embodiment of the invention is arranged to use in common an electric power amplifier AMP constituted by at least an active element (amplification element), such as a transistor (including Field Effect Transistor (FET)) for high frequency signals of the plural types of frequency bands FB to be inputted. In other words, it is basically arranged that the signals of the plural types of frequency bands FB are amplified with a common (also referred to as single-line) amplification means, i.e., a common active element.

The active element for electric power amplification is used in common to the signals of the plural types of frequency bands, to thereby avoid miniaturization and reduced costs of a single component which is needed in the case where an individual electric power amplification circuit suited for each frequency band is provided.

For example, when a system corresponding to a carrier frequency band newly added is constructed as frequency reorganization, it is unnecessary to add the electric power amplification circuit for each band corresponding to a new frequency band because of reorganization of mobile communications carrier frequencies to a mobile communications terminal apparatus, thereby allowing the present transmission system domain to maintain. This is an effective arrangement in developing a transmission amplifier of the mobile phone corresponding to the plural types of frequency bands, while frequency multi-bands for mobile phones are being developed.

In the system, the electric power amplifier AMP has a one-stage arrangement, and may be arranged to obtain an amplification factor Ao required to obtain the certain desired output electric power. Alternatively, employing the plural-stage structure of two or more stages, it may be arranged to assign the amplification factor Ao required to obtain the certain desired output electric power, to electric power amplifiers AMP1-AMPn (where n is a positive integer greater than or equal to two) of the respective stages by way of suitable ratios.

In the arrangement, the electric power amplifier AMP is one single-line for the plural types of frequency bands FB irrespective of the number of stages of the electric power amplifiers AMP. In other words, since the electric poser amplifier AMP is commonized, it is provided that the characteristics are broadened in bands so as to suit the plural types of frequency bands FB.

When employing the plural-stage structure, methods of assigning the amplification factor to each stage may be broadly divided into two, one is equal assignment, and the other is unequal assignment. However, it is in fact preferable that the former stage provides a higher amplification factor than the latter stage in order to realize the broadened band (as will be described in detail).

However, there is a limit for attaining a wide frequency band only with one single-line electric power amplifier AMP.

It is difficult to attain the wide frequency band so as to suit the plural types of frequency bands FB within a frequency range as required by CDMA. To cope with this, embodiments of the present invention provide the following structure.

Namely, as a feature of the transmission power amplifying circuit 1 of an embodiment of the present invention, a matching circuit M for matching impedance with respect to the signals of the plural types of frequency bands FB are provided on a signal input side and a signal output side of the electric power amplifier AMP.

The matching circuit M has an impedance conversion function, and operates to match an output impedance of a circuit connected to the input side with an input impedance of the electric power amplifier AMP within a desired frequency band FB. Further, the matching circuit M operates to match the output impedance of the electric power amplifier AMP with the input impedance of a circuit connected to the output side of the electric power amplifier AMP.

The matching circuit M is composed of, for example, a combination of an inductance element and a capacitance element (capacitor). Further, it is arranged to obtain a desired impedance characteristic and have a desired element constant, within the desired frequency band FB.

In this construction, it is also considered that the matching circuit M (particularly referred to as input stage matching circuit Mi) of the input stage provided on the input side of the electric power amplifier AMP and the matching circuit M (particularly referred to as output stage matching circuit Mo) of the output stage provided on the output side of the electric power amplifier AMP may have the same structure and element constant. However, practically the input impedance and output impedance of the electric power amplifier AMP are usually different from each other. It is therefore preferable that the input stage matching circuit Mi and the output stage matching circuit Mo have respective structures and element constants optimized with respect to each impedance matching on the input side and output side, to match the respective impedances.

Further, in the case of employing the plural-stage structure in which the plurality of amplification circuits (electric power amplifiers AMP) are arranged in cascade, it is preferable to provide between stages the matching circuit M (in particular referred to as interstage matching circuit Mm) which performs impedance matching between the output impedance of the electric power amplifier AMP (active element) at the former stage and the input impedance of the latter electric power amplifier AMP (active element). Also in this case, it is preferable to have the structure and element constants optimized with respect to each impedance matching on the input side and output side and between stages.

Further, the signal input side and the signal output side of the electric power amplifier AMP may be provided with the path-selecting switch circuit SW by means of the transistor (especially field effect transistor is preferable) for separating the respective paths as a signal path switching unit (switch means) for the signals of the plural types of frequency bands FB as needed. That is, it may be arranged that a desired path is selected by the signal path switching unit and the signal is amplified by the single-line electric power amplifier AMP.

Further, in the case of where plural stages of electric power amplifiers AMP are arranged, when the interstage matching circuit Mm is provided for each frequency band FB, the signal input side and the signal output side of the interstage matching circuit Mm for each frequency band FB are provided with the path-selecting switch circuit SW for separating the respective paths as the signal path switching unit (switch means), with respect to the signals of the plural types of frequency bands FB.

In this case, a position in which the path-selecting switch circuit SW is arranged may be on the signal input side of the matching circuit M, or may be the signal output side of the matching circuit M.

For example, in the signal input side of the electric power amplifier AMP, an m input—1 output type path-selecting switch circuit SW is used first, where "m" means the number of band classifications of the signals of the plural types of frequency bands FB, and is a positive integer greater than or equal to two. In other words, the signals of m types of frequency bands FB are dealt with.

A first arrangement may be employed in which the input stage matching circuits Mi are provided for the respective signals of m types of frequency bands FB (i.e., for the respective frequency bands FB), the signals of m types of frequency bands FB are inputted into the respective input stage matching circuits Mi for the respective frequency bands FB, the outputs are inputted into the respective input terminals of the path-selecting switch circuit SW, and the outputs are inputted into the electric power amplifier AMP. Alternatively, a second arrangement may also be employed in which the signals of m types of frequency bands FB are inputted into the respective input terminals of the path-selecting switch circuit SW, the outputs are inputted into one input stage matching circuit Mi, and its output is inputted into the electric power amplifier AMP.

Further, in the signal output side of the electric power amplifier AMP, a 1 input—m output type path-selecting switch circuit SW is used first. As with the above, "m" means the number of band classifications of the signals of the plural types of frequency bands FB, and is a positive integer greater than or equal to two.

A first arrangement may be employed in which the output stage matching circuits Mo are provided for the respective signals of m types of frequency bands FB (i.e., for respective frequency bands FB), the output signal of the electric power amplifier AMP is inputted into one input terminal of the path-selecting switch circuit SW, the output signal from each output terminal is inputted into the output stage matching circuit Mo for each frequency band FB, and its output signal is passed to the outside (for example, antenna output circuit ANT etc.). Alternatively, a second arrangement may be employed in which the output signal of the electric power amplifier AMP is inputted into one output stage matching circuit Mo, the output is inputted into one input terminal of the path-selecting switch circuit SW, and the output signal from each output terminal is passed to the antenna output circuit ANT etc.

Further, when the plural stages of electric power amplifiers AMP are arranged, in the case of providing the interstage matching circuit Mm for each frequency band FB, the one input—m output type path-selecting switch circuit SW is provided on the input side of the interstage matching circuit Mm, and the m input—one output type path-selecting switch circuit SW is provided on the output side of the interstage matching circuit Mm.

The output signal of the electric power amplifier AMP at the former stage is inputted into the input terminal of the one input—m output type path-selecting switch circuit SW, the output signal from each output terminal is inputted into the interstage matching circuit Mm for each frequency band FB, its output signal is inputted into each input terminal of the m input—one output type path-selecting switch circuit SW, and its output is inputted into the latter-stage electric power amplifier AMP.

In any case, one matching circuit M is provided for the plural types of frequency bands FB irrespective of whether the path-selecting switch circuit SW is provided or not. In other words, when the matching circuit is common to the signals in the plural types of frequency bands, the characteristics is attained such a wide band frequency that the plural types of frequency bands FB may be suited.

Thus, in the arrangement of the transmission power amplifying circuit 1 of embodiments of the present invention, the signals in the plural types of frequency bands FB are inputted into the electric power amplifier AMP through the input stage matching circuit Mi, and amplified them. Then, the output signal is supplied to the antenna output circuit ANT etc. through the output stage matching circuit Mo. Thus, even in the case where the common amplification means (electric power amplifier AMP) is used to the signals of the plural types of frequency bands FB, the transmission power amplifying circuit 1 as a whole may cope with the broadened band. Since it is not necessary to provide the electric power amplifiers AMP with the signals of the plural types of frequency bands FB respectively, for each frequency band, it is possible for the mobile communications terminal apparatus to maintain the transmitting system domain comparable with the present one, and it is unnecessary to add the power amplifier (especially electric power amplifier AMP) for a new frequency band FB.

Further, when the arrangement by means of the path-selecting switch circuit SW is employed, it allows to maintain the transmitting system as it is if a switch system (path-selecting switch circuit SW of an embodiment of the present invention) required for switching frequencies is built in the transmission power amplifying circuit 1 on the system of mobile communications terminal apparatus.

The transistor as the active element used for the electric power amplifier AMP or the path-selecting switch circuit SW may be a high-electron mobility transistor (HEMT; High Electron Mobility Transistor) which is obtained by using a compound semiconductor, such as gallium arsenide (GaAs), aluminum gallium and arsenide (AlGaAs), and indium gallium arsenide (InGaAs), to hetero-junction (junction of two types of different semiconductor materials) and which is an example of an ultra high-speed transistor using the character in which an electron moves at a high speed along a junction.

A fundamental structure is such that an undoped GaAs layer which is an electron transit layer (channel layer) and an n type AlGaAs layer which is an electron supply layer (doped layer) are stacked on a half-insulation substrate, such as GaAs.

The undoped GaAs which constitutes the electron transit layer of the usual HEMT may be replaced with another material (for example, InGaAs) which is pseudomorphic (pseudomorphic), to thereby use a pseudomorphic HEMT which realizes higher mobility and a higher electron concentration.

When the electron transit layer of each compound semiconductor and the electron supply layer of each compound semiconductor are joined (hetero-junction), discontinuity arises in a conduction band, a valence band, and both bands at the boundary. Since the field intensity which is inclination of the conductor changes continuously, the conduction band has lower energy than a Fermi level in the electron transit layer near the electron supply layer boundary. As a result, excessive electrons (referred to as 2-dimensional electron gas) are induced in this domain.

As a result, since the electron supply layer and the electron transit layer are separated, the factor causing high resistance, such as Coulomb scattering by donor ions etc. at the time of electron transit can be reduced, and on-resistance can be decreased. Therefore, it is possible to realize an active element whose work speed is fast and which is suitable for a high frequency amplification element and a high frequency switching element.

For example, a high-electron mobility transistor may be obtained in such a manner that a high mobility electron transit layer using a hetero-junction boundary is formed between a plurality of semiconductor layers laminated on a substrate of compound semiconductors, such as Ga—As, a diffusion layer is provided for at least one side of the plurality of semiconductor layers, where impurities are doped, to thereby form a gate by pn junction, and a source electrode or a drain electrode is formed through an ohmic connection layer on the diffusion layer. A high-electron mobility transistor of such a structure is particularly referred to as JP-HEMT (Junction Pseudomorphic HEMT; junction pseudomorphic HEMT).

Employing a JP-HEMT where a gate of a high-electron mobility transistor is pn junction, it is possible to operate by means of a single positive power supply and it is also possible to remove peripheral components, such as a negative power supply generating circuit. Further, the on-resistance can be reduced to be smaller than that of a Schottky junction gate requiring a recess structure, and the active element suitable for the high frequency amplification element and the high frequency switching element can be obtained.

Further, the high-electron mobility transistor is at least used for the active element constituting the electric power amplifier AMP or a switch element constituting the path-selecting switch circuit SW, to thereby form the transmission power amplifying circuit 1 with one chip.

Next, a basis of the circuit structure for embodying the various transmission power amplifying circuits 1 by combining the respective elements as explained above will be described with reference to several functional block diagrams.

<Basic Structure 1>

FIGS. 1A-1C are circuit block diagrams for explaining a first example of a basic structure. FIG. 1A shows the first example, and FIG. 1B shows a second example. Further, each figure of FIG. 1C shows an example of a structure of each of the matching circuits M. In each figure of FIG. 1C, C* is a capacitance element and L* is an inductance element ("*" is 1-5).

Each transmission power amplifying circuit 1 is suitable for use in mobile phones or communication terminal apparatuses of various systems, for example, a CDMA (Code Division Multiple Access) system, a PDC (Personal Digital Cellular) system, or the like.

The first example of the basic structure as shown in FIG. 1A is the most basic structure where the input stage matching circuit Mi is provided on the signal input side of a one-stage electric power amplifier AMP of one-stage structure and the output stage matching circuit Mo is provided on the signal output side.

The matching circuits M for matching impedances are provided on the input side and output side of one electric power amplifier AMP, to thereby secure an amplification factor AO required in order to obtain the certain desired output electric power with only one electric power amplifier AMP and to cope with the high frequency signals of the required plural types of frequency bands FB. Even if the electric power amplifier AMP is of a single-line, it causes the transmission power amplifying circuit 1 to operate so that the characteristic may be acquired at each frequency band FB.

Signals of a frequency band FB1—a frequency band FB2 supplied via an input terminal 2 pass through a matching circuit 3 (input stage matching circuit Mi) adjusted to the frequency band FB1—the frequency band FB2, are amplified with an amplification circuit 4 (electric power amplifier AMP) by a factor of A0, pass through a matching circuit 7 (output stage matching circuit Mo) adjusted to the frequency band FB1—the frequency band FB2, then are outputted via an output terminal 9 as the output signals of the frequency band FB1—the frequency band FB2.

Hereafter, the matching circuit 3 (input stage matching circuit Mi) and the matching circuit 7 (output stage matching circuit Mo) may be grouped and simply explained as the matching circuit M.

In the figures, the signal of the frequency band FB1 is a high frequency signal with a bandwidth BW1 at a center frequency F10, and the signal of the frequency band FB2 is a high frequency signal with a bandwidth BW2 at a center frequency F20.

On the other hand, in the second example of the basic structure as shown in FIG. 1B, the electric power amplifier AMP has a two-stage structure where electric power amplifiers AMP_1 and AMP_2 are provided, the input stage matching circuit Mi is arranged on the signal input side of the first-stage electric power amplifier AMP_1, the interstage matching circuit Mm is arranged between the signal output side of the first-stage electric power amplifier AMP_1 and the signal input side of the second-stage electric power amplifier AMP_2, and the output stage matching circuit Mo is arranged on the signal output side of the second electric power amplifier AMP_2.

Hereafter, the matching circuit 3 (input stage matching circuit Mi), the matching circuit 5 (interstage matching circuit Mm), and the matching circuit 7 (output stage matching circuit Mo) may be grouped and simply explained as the matching circuit M.

The plural stages of electric power amplifiers AMP makes a amplification factor assigned to the electric power amplifier AMP of each stage (two stages, in this example) decrease, so that the electric power amplifier AMP of each stage is easy to broaden the band.

In other words, the signals of the frequency band FB1—the frequency band FB2 supplied through the input terminal 2 pass through the matching circuit 3 (input stage matching circuit Mi) adjusted to the frequency band FB1—the frequency band FB2, are amplified with the first-stage amplification circuit 4 (electric power amplifier AMP_1) by a factor of A1, further pass through the matching circuit 5 (interstage matching circuit Mm) adjusted to the frequency band FB1—the frequency band FB2, and are amplified with a second-stage amplification circuit 6 (electric power amplifier AMP_6) by a factor of A2.

Furthermore, passing through the matching circuit 7 (output stage matching circuit Mo) adjusted to the frequency band FB1—the frequency band FB2, they are outputted via the output terminal 9 as the output signals of a desired output electric power of the frequency band FB1—the frequency band FB2. The overall amplification factor is obtained by synthesizing the amplification factors A1 and A2 of the respective stages, to thereby secure the amplification factor A0 (=A1+A2) required in order to obtain the desired output electric power.

The methods of assigning (how to distribute) the amplification factor to each stage may be roughly classified into two. One concept is equal assignment, and the other concept is unequal assignment. The latter the stage is, the larger a signal level is, where a larger-sized transistor (FET, in this example) is required. Therefore, it is in fact difficult to realize the broadened band at a high signal level. On the other hand, when the signal level is small, the transistor (FET in this example) may be small in size. Thus, it is comparatively easy to attain the broadened band and there are few obstacles in order to increase the amplification factor A compared with the latter electric power amplifier AMP. In short, even if the active element is the same, a frequency range of the maximum amplification factor Amax in an intact (in the situation where negative feedback is not applied) amplification factor characteristic may be wide when the signal level is small. But, it has a tendency of being narrow when the signal level is large.

In consideration of this point, in terms of broadening the band as a whole, it would be convenient that the amplification factor of the electric power amplifier AMP at the former stage for the low signal level is set to be greater than the amplification factor of the electric power amplifier AMP of the latter stage for the high signal level. In the case of the two-stage structure as shown in FIG. 1B, it is preferable that the amplification factor A1 of the first-stage amplification circuit 4 is set as a medium to high amplification factor, and the amplification factor A2 of the second-stage amplification circuit 6 is set as a low to medium amplification factor.

However, in the case of the first example of the basic structures (basic 1_1, 1_2), since the matching circuits M (Mi, Mm, Mo) are common to the signals of the plural types of frequency bands FB1 and FB2, it is necessary for one matching circuit M to correspond to the signals of n types (two types in the figure) of frequency bands FB. Further, it is necessary for the characteristic of the matching circuit M itself to suit the whole frequency band FB whose impedance characteristics are of n types. Namely, the need for broadening band to the plural types of frequency band of the matching circuit M in this example creates difficulty in circuit design.

For example, as for the input stage matching circuit Mi, as shown in (C1) of FIG. 1C, a C1-L1-C2 type structure may be employed, but it is more difficult to select the element constants in that case than to correspond to the signal of one type of frequency band FB.

Similarly, as for the interstage matching circuit Mm, a structure as shown in (C1) of FIG. 1C as in the case of the input stage matching circuit Mi may be employed. Alternatively, as shown in (C2) of FIG. 1C, a C0-L1-C1-L2-C2 type structure may be employed. However, it is more difficult to select the element constants in that case than to correspond to the signal of one type of frequency band FB. Further, it is possible to cause the capacitance element C2 in this case to function only for blocking direct current, without causing it to function for matching impedances.

Further, as for the output stage matching circuit Mo, as shown in (C3) of FIG. 1C, a C1-C2-L1-C3-L2-C4-C5 type structure may be employed. However, it is severer to select the element constants in that case than to correspond to the signal of one type of frequency band FB. In addition, it is possible to cause the capacitance elements C1 and C5 in this case to function only for blocking the direct current, without causing them to function for matching impedances.

<Basic Structure 2>

Figure 2B:
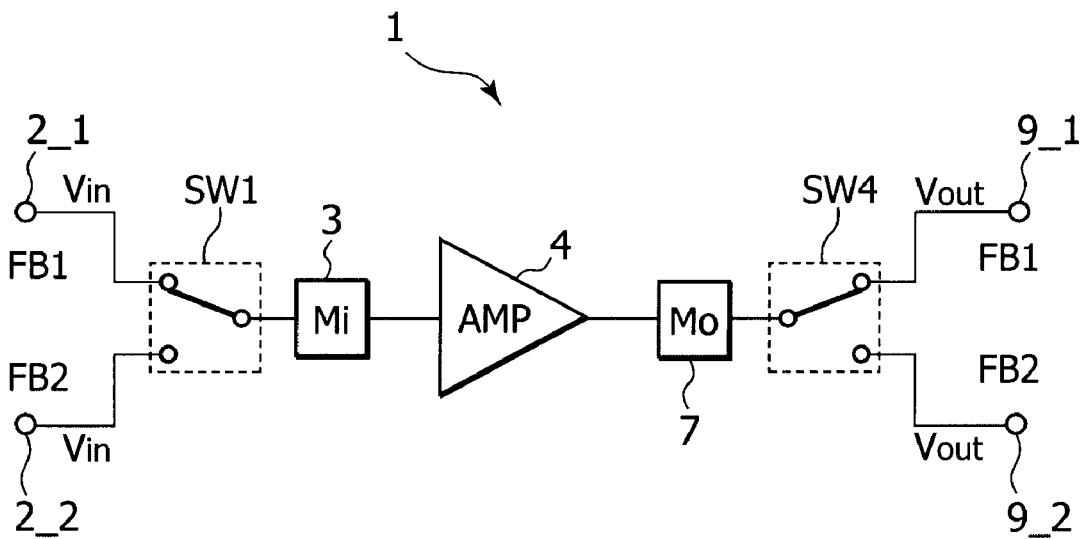

Further, the second example of the basic structures as shown in FIGS. 2A and 2B are a modification of the first example of the basic structure shown in FIG. 1A and provided with the electric power amplifier AMP with the one-stage structure. It is arranged that the path-selecting switch circuit SW as the signal path switching unit is provided to output/input the signal from/into the electric power amplifier AMP for each frequency band FB, the desired path is selected with the signal path switching unit, and the signal is amplified with the single-line electric power amplifier AMP.

The second example of the basic structure as shown in FIG. 2A is such that a path-selecting switch circuit SW1 on the input side of the electric power amplifier AMP is on the signal output side of the input stage matching circuit Mi, and a path-selecting switch circuit SW4 on the output side of the electric power amplifier AMP is on the signal input side of the output stage matching circuit Mo.

In other words, the signal of the frequency band FB1 supplied via one input terminal 2_1 passes through a matching circuit 3_1 (input stage matching circuit Mi_1) adjusted to the frequency band FB1 and the path-selecting switch circuit SW1, is amplified by the amplification circuit 4 (electric power amplifier AMP), passes through the path-selecting switch circuit SW4 and the matching circuit 7_1 (output stage matching circuit Mo_1) adjusted to the frequency band FB1, and is outputted through one output terminal 9_1 as an output signal of the frequency band FB1.

Further, the signal of the frequency band FB2 supplied via the other input terminal 2_2 passes through a matching circuit 3_2 (input stage matching circuit Mi_2) adjusted to the frequency band FB2 and the path-selecting switch circuit SW1, is amplified by the amplification circuit 4 (electric power amplifier AMP), passes through the path-selecting switch circuit SW4 and a matching circuit 7_2 (output stage matching circuit Mo_2) adjusted to the frequency band FB2, and is outputted via the other output terminal 9_2 as an output signal of the frequency band FB2.

Thus, the electric power amplifier AMP of one-stage structure is common to the signals of the plural types of frequency bands FB to amplify them. On the other hand, the matching circuits 3 and 7 adjusted to the frequency bands FB1 and FB2 respectively are provided for the respective frequency bands FB, and the desired path is selected using the path-selecting switch circuits SW1 and SW4, whereby the transmission power amplifying circuit 1 can be operated so that the characteristics may be acquired for each of the frequency bands FB1 and FB2, employing only one path of FETs as the amplification elements.

In such an arrangement, it is necessary to provide each of the input stage matching circuit Mi and the output stage matching circuit Mo for each frequency band FB, and its circuit scale is enlarged. However, each of the input stage matching circuit Mi and the output stage matching circuit Mo may only be adapted to the assigned frequency band FB (FB1, FB2 in this example). There is an advantage of providing a wide range of choice for circuit structures and element constants.

In other words, it is preferable that the second example of basic structure as shown in FIG. 2A is used when the plural types of frequency bands FB (frequency band FB1 and frequency band FB2 in this example) are relatively broad.

On the other hand, in the second example of basic structure as shown in FIG. 2B, the path-selecting switch circuit SW1 on the input side of the electric power amplifier AMP is on the signal input side of the input stage matching circuit Mi, and the path-selecting switch circuit SW4 on the output side of the electric power amplifier AMP is on the signal output side of the output stage matching circuit Mo.

In other words, the signal of the frequency band FB1 supplied via one input terminal 2_1 passes through the path-selecting switch circuit SW1 and the matching circuit 3 (input stage matching circuit Mi) adjusted to the frequency band FB1—the frequency band FB2, is amplified by the amplification circuit 4 (electric power amplifier AMP), passes through the matching circuit 7 (output stage matching circuit Mo) adjusted to the frequency band FB1—the frequency band FB2 and the path-selecting switch circuit SW4, and is outputted as the output signal of the frequency band FB1 via one output terminal 9_1.

Further, the signal of the frequency band FB2 supplied via the other input terminal 2_2 passes through the path-selecting switch circuit SW1 and the matching circuit 3 (input stage matching circuit Mi) adjusted to the frequency band FB1—the frequency band FB2, is amplified by the amplification circuit 4 (electric power amplifier AMP), passes through the matching circuit 7 (output stage matching circuit Mo) adjusted to the frequency band FB1—the frequency band FB2 and the path-selecting switch circuit SW4, and is outputted as the output signal of the frequency band FB2 via the other output terminal 9_2.

In such an arrangement, one input stage matching circuit Mi and one output stage matching circuit Mo are required to be adapted to the plural types of frequency bands FB. Thus, the range of choice for the circuit structure or the element constants may be narrower. However, it is constituted by one single-line only, not only the electric power amplifier AMP, but also each of the input stage matching circuit Mi and the output stage matching circuit Mo, thus there is an advantage of reducing the circuit scale.

In other words, it is preferable that the second example of the basic structure as shown in FIG. 2B is used when the plural types of frequency bands FB (frequency band FB1 and frequency band FB2 in this example) are relatively narrow.

The arrangement where one input stage matching circuit Mi or output stage matching circuit Mo is used in common to the plural types of frequency bands FB (frequency band FB1 and frequency band FB2 in this example) is similar to those of the first example of the basic structure as shown in FIG. 1A or the first example of the basic structure as shown in FIG. 1B. Therefore, it is preferable that the first example of the basic structures as shown in FIGS. 1A and 1B is used when the plural types of frequency bands FB (frequency band FB1 and frequency band FB2 in this example) are relatively narrow.

<Basic Structure 3>

A third example of basic structures as shown in FIGS. 3A and 3B is a modification of the first example of the basic structure as shown in FIG. 1B and provided with the electric power amplifier AMP of the plural-stage (two stages in particular) structure. It is arranged that the path-selecting switch circuit SW as the signal path switching unit is provided in order to output/input the signal from/into each of the electric power amplifier AMP_1 and AMP_2 for each frequency band FB, the desired path is selected by the signal path switching unit, and the signal is amplified with the single-line electric power amplifier AMP.

Especially with respect to the interstage, it is arranged such that the signal of the frequency band FB1 outputted from the first-stage amplification circuit 4 (electric power amplifier AMP_1) passes through a path-selecting switch circuit SW2, a matching circuit 5_1 (interstage matching circuit Mm_1) adjusted to the frequency band FB1, and a path-selecting switch circuit SW3, and is inputted into the second-stage amplification circuit 6 (electric power amplifier AMP_2), as well as the signal of the frequency band FB2 outputted from the first-stage amplification circuit 4 (electric power amplifier AMP_1) passes through the path-selecting switch circuit SW2, a matching circuit 5_2 (interstage matching circuit Mm_2) adjusted to the frequency band FB2, and the path-selecting switch circuit SW3, and is inputted into the second-stage amplification circuit 6 (electric power amplifier AMP_2).

The input side of the first-stage electric power amplifier AMP_1 and the output side of the second-stage electric power amplifier AMP_2 of the third example of the basic structure as shown in FIG. 3A are respectively similar to those of the second example of the basic structure as shown in FIG. 2A. Further, it is arranged such that the path-selecting switch circuits SW2 and SW3 as the signal path switching units are provided between the output side of the first-stage electric power amplifier AMP_1 and the input side of the second-stage electric power amplifier AMP_2 in order to output/input the signal from/into the interstage matching circuit Mm for each frequency band FB, the desired path is chosen by the signal path switching unit, and the signal is amplified by the single-line electric power amplifier AMP as a whole. Fundamentally, it is possible to enjoy the effect of the first example of the basic structure and the effect of the second example of the basic structure.

On the other hand, the input side of the first-stage electric power amplifier AMP_1 and the output side of the second-stage electric power amplifier AMP_2 of the third example of the basic structure as shown in FIG. 3B are respectively similar to those of the second example of the basic structure as shown in FIG. 2B. Further, the path-selecting switch circuits SW2 and SW3 as the signal path switching units are provided between the output side of the first-stage electric power amplifier AMP_1 and the input side of the second electric power amplifier AMP_2 in order to output/input the signal from/into the interstage matching circuit Mm for each frequency band FB, the desired path is chosen by the signal path switching units, and the signal is amplified with the single-line electric power amplifier AMP as a whole. Fundamentally, it is possible to enjoy the effect of the first example of the basic structure and the effect of the second example of the basic structure.

Especially, the interstage matching circuit Mm disposed between the stages is provided for each frequency band FB and a first-stage amplification FET and a second-stage amplification FET are common to amplify in multiple stages the signals of the plural types of frequency bands FB. On the other hand, the matching circuit M adjusted to each of the frequency bands FB1 and FB2 is separately provided for the input side, the interstage, and the output side, and the desired path is selected using the path-selecting switch circuit SW, whereby the transmission power amplifying circuit 1 can be operated so that the characteristic may be acquired for each of the frequency bands FB1 and FB2, employing only one path of FETs as the amplification elements.

In such an arrangement, it is necessary to provide the interstage matching circuit Mm for each frequency band FB, and its circuit scale is enlarged. However, the interstage matching circuit Mm may only be adapted to the assigned frequency band FB (FB1, FB2 in this example). There is an advantage of expanding a range of choice for the circuit structures and the element constants.

In other words, as for the third example of basic structures as shown in FIGS. 3A and 3B, irrespective of what type of structure the source side of the second-stage amplification FET 62 is, it is preferable that the interstage matching circuit Mm is used when the plural types of frequency bands FB (frequency band FB1 and frequency band FB2 in this example) are relatively broad.

It is different from a basic structure 4 to be set forth later or the structures of the fourth to the sixth embodiments, in that the path-selecting switch circuits SW2 and SW3 are removed, and an impedance element is required to be provided on the source side of the second-stage amplification FET 62, to reduce the amplification factor of the second-stage amplification FET 62 and to cope with the broadband in order for one interstage matching circuit Mm to be adapted to the plural types of frequency bands FB and the broadband.

<Basic Structure 4>

Figure 4A:
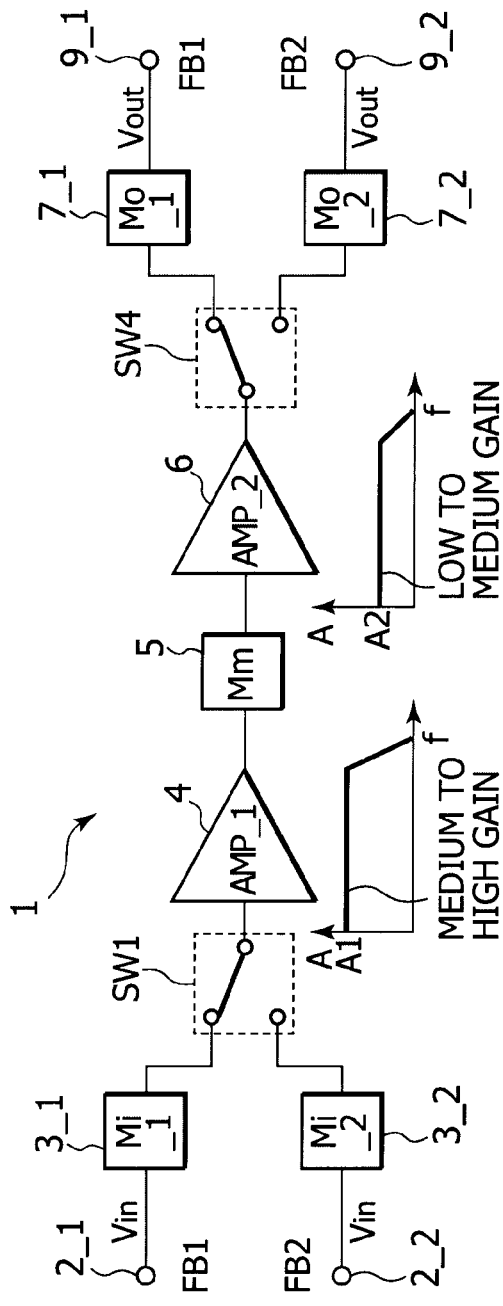
FIGS. 4A and 4B are circuit block diagrams for explaining a fourth example of a basic structure.
Figure 4B:
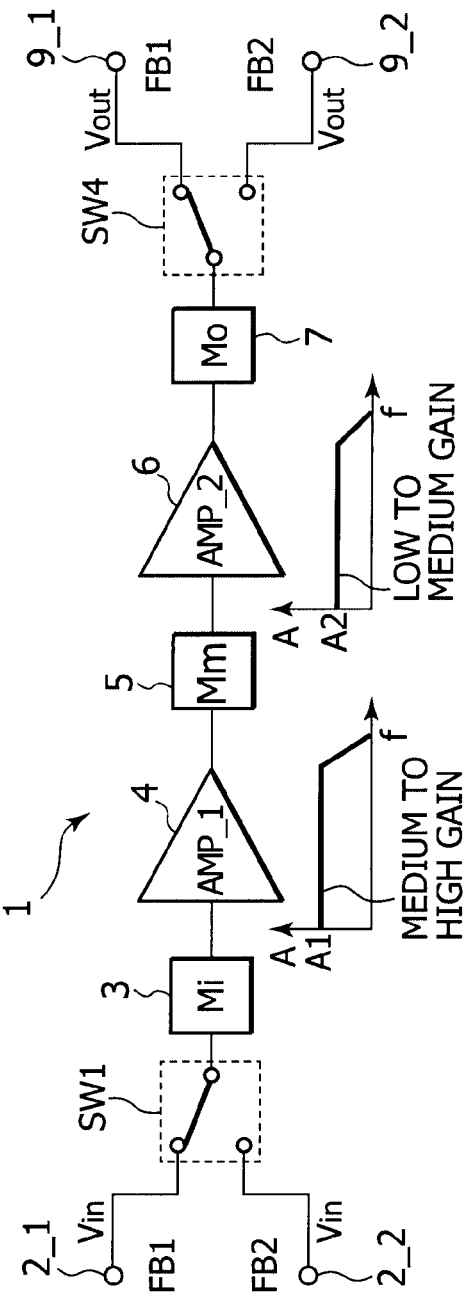

Further, a fourth example of a basic structure as shown in FIG. 4A is a modification of the third example of the basic structure as shown in FIG. 3A, and the fourth example of a basic structure as shown in FIG. 4B is a modification of the third example of the basic structure as shown in FIG. 3B. It is arranged such that the single-line interstage matching circuit Mm adapted to the plural types of frequency bands FB is provided between the output side of the first-stage electric power amplifier AMP_1 and the input side of the second-stage electric power amplifier AMP_2.

Also in these cases, the path-selecting switch circuits SW1 and SW4 as the signal path switching units are provided. It is similarly arranged that, as a whole, the desired path is chosen by the signal path switching unit, and the signal is amplified with the single-line electric power amplifier AMP.

The interstage matching circuit Mm provided between the stages is required to be provided and adapted not for each frequency band FB but to the frequency band FB1—the frequency band FB2. As a whole, the first-stage amplification FET and the second-stage amplification FET are common to the signals of the plural types of frequency bands FB amplified in multiple stages. On the other hand, the matching circuit M adjusted to each of the frequency bands FB1 and FB2 is separately provided for the input side and the output side, and the desired path is selected using the path-selecting switch circuit SW, whereby the transmission power amplifying circuit 1 can be operated so that the characteristic may be acquired for each of the frequency bands FB1 and FB2, employing only one path of FETs as the amplification elements.

In such an arrangement, it is necessary to be adapted to the plural types of frequency bands FB by means of the single-line interstage matching circuit Mm only, leading to a narrow range of choice for the circuit structure and the element constants. However, as the interstage matching circuit Mm between the stages may be of one single-line, so that the circuit scale can be advantageously reduced.

In other words, as for the fourth example of the basic structures as shown in FIG. 4, irrespective of what type of structure the source side of the second-stage amplification FET 62 is, it is preferable that the interstage matching circuit Mm is used when the plural types of frequency bands FB (frequency band FB1 and frequency band FB2 in this example) are relatively narrow.

Like the structures of the fourth to the sixth embodiments to be set forth later in which the path-selecting switch circuits SW2 and SW3 are removed to cause one interstage matching circuit Mm to cope with the plural types of frequency bands FB with the broad bands, it is necessary to provide the impedance element on the source side of the second-stage amplification FET 62, to reduce the amplification factor of the second-stage amplification FET 62 and to cope with the broadband. However, the plural types of frequency bands FB with narrow bands do not necessarily require to reduce the amplification factor of the second-stage amplification FET 62 and to cope with the broadband.

The arrangement where one interstage matching circuit Mm is used in common to the plural types of frequency bands FB (frequency band FB1 and frequency band FB2 in this example) is similar to that of the first example of the basic structure as shown in FIG. 1B. Therefore, it is preferable that the first example of the basic structure as shown in FIG. 1B is used when the plural types of frequency bands FB (frequency band FB1 and frequency band FB2 in this example) are relatively narrow, irrespective of what type of structure the source side of the second-stage amplification FET 62 is.

The examples shown in FIGS. 3A and 3B, and FIGS. 4A and 4B are illustrated with the example of structure corresponding to two types of frequency bands FB while the electric power amplifier AMP has the two-stage structure. Each number may be three or more. For example, in the example as shown in FIG. 3A, when signals of n types of frequency bands FB are inputted, n types (sets) of the matching circuit 3 on the input side, the matching circuit 5 between stages, the matching circuit 7 on the output side, the path-selecting switch circuits SW that switch the signal path, the input terminal 2 and the output terminal 9 are arranged in parallel to cope with the signals.

In the example shown in FIG. 4A, when the signals of n types of frequency bands FB are inputted, n types (sets) of the matching circuit 3 on the input side and the matching circuit 7 on the output side, the path-selecting switch circuits SW that switches the signal path, the input terminal 2 and the output terminal 9 are arranged in parallel to cope with the signals.

Further, in the case where the transmission power amplifying circuit 1 is constituted by m stages of electric power amplifiers AMP, it can cope with the signals by providing the interstage matching circuit Mm at each interstage. Further, in this case, as with the example as shown in FIG. 3, the interstage matching circuit Mm and the path-selecting switch circuit SW may be provided at each interstage for each frequency band FB. Further, as with the example as shown in FIG. 4, one interstage matching circuit Mm adapted to the overall frequency band FB (the frequency band FB1—frequency band FBm) may be provided.

In the second to fourth examples of the basic structures as shown in FIGS. 2A, 3A, and 4A, although each of the input stage matching circuit Mi and the output stage matching circuit Mo is provided for each frequency band FB, either one may use one matching circuit M adjusted to the plural types of frequency bands FB to be common to them. In other words, either one may be common or independent.

In this case, with respect to the matching circuit M which is not common (either the input stage matching circuit Mi or the output stage matching circuit Mo), the path selection is performed by the path-selecting switch circuit SW with respect to the high frequency signals of the plural types of frequency bands FB. It is easy to draw required characteristics (amplification factor AO and broadened band required to obtain a desired output electric power) of the transmission power amplifying circuit 1.

In other words, in view of the size of the transmission power amplifying circuit 1 as a whole and the balance of the characteristics, it is preferable to determine whether each of the matching circuits M on the input side and output side is common or independent to the plural types of frequency bands FB.

Naturally, the same applies to the interstage matching circuit Mm between stages. It is preferable to determine whether the matching circuit M between stages (interstage matching circuit Mm) is independent to the plural types of frequency bands FB (i.e., the third example of basic structures is employed) or used in common (i.e., the fourth example of basic structures is employed).

Next, particular examples of the structure will be described. In every example, the structure is illustrated corresponding to two types of frequency bands FB1 and FB2. Further, "G" denotes the gate terminal as a control input terminal of FET, "S" denotes the source terminal as the input terminal, and "D" indicates the drain terminal as the output terminal.

First Embodiment

Figure 5:
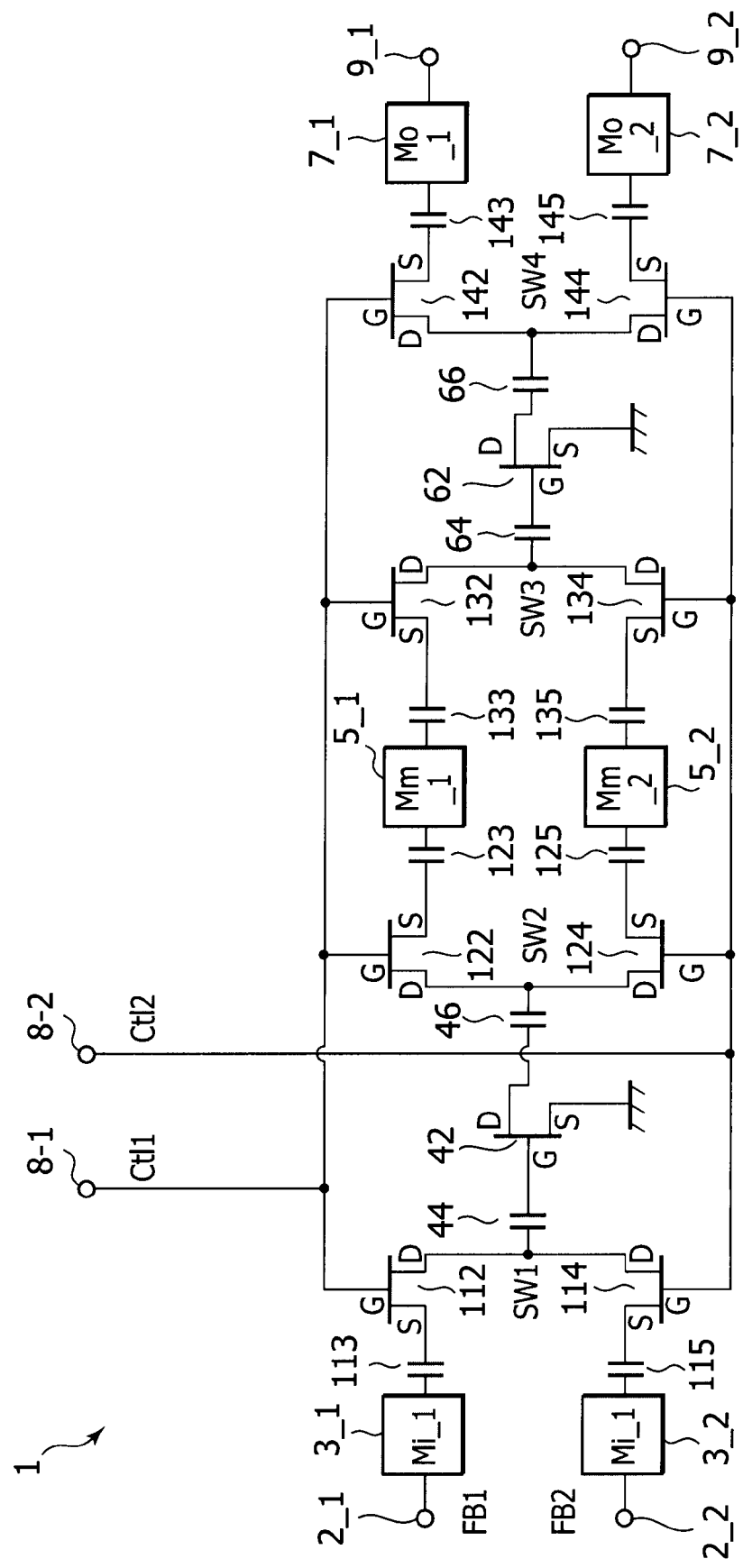
FIG. 5 is a circuit diagram showing a first embodiment of a transmission power amplifying circuit.
Figure 6:
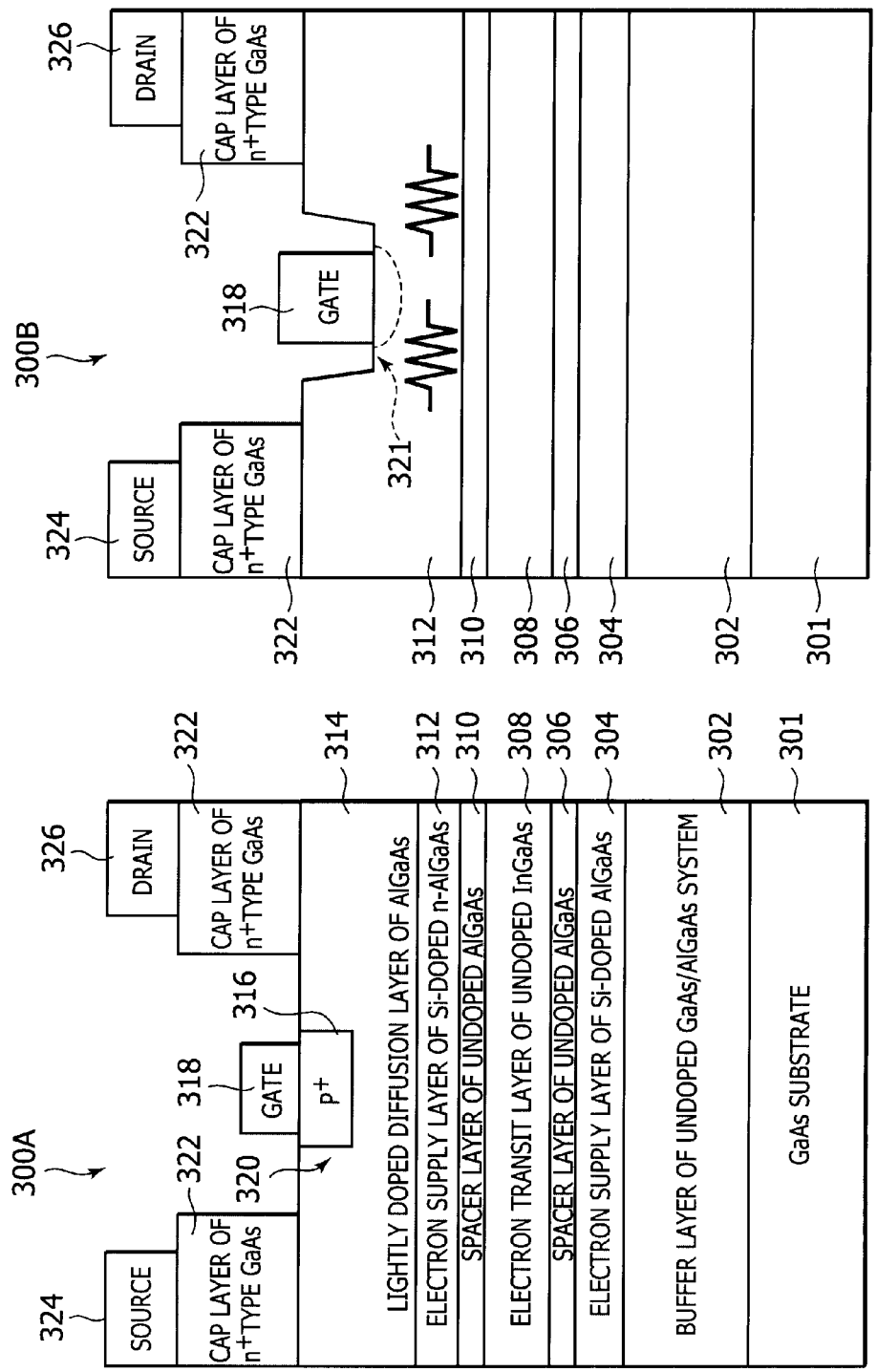
FIGS. 6A and 6B are diagrams showing examples of a structure of JP-HEMT as an amplification element suitable for use in the electric power amplification circuit of each embodiment.

FIGS. 5 and 6 are diagrams for explaining a first embodiment of an example of a structure of the transmission power amplifying circuit 1. Here, FIG. 5 is a circuit diagram showing the first embodiment of the transmission power amplifying circuit 1. Further, FIG. 6 is a diagram showing an example of a structure of JP-HEMT as an amplification element suitable for use in the electric power amplification circuit 1 of the first embodiment (others which will be described later are also the same).

The transmission power amplifying circuit 1 of the first embodiment embodies the third example of basic structure as shown in FIG. 3A. In other words, as shown in FIG. 5, the transmission power amplifying circuit 1 of the first embodiment where it is assumed that high frequency signals of two types of frequency bands FB1 and FB2 are inputted is provided with amplification FET 42 that constitutes the first-stage amplification circuit 4 and amplification FET 62 that constitutes the second-stage amplification circuit 6, which are two FETs for electric power amplification. Amplification FETs 42 and 62 whose source terminals are grounded directly constitute a source grounding amplifier circuit. Therefore, the gain(amplification factor) is determined with its own mutual conductance gm and may be thought to be considerably high.

Further, the transmission power amplifying circuit 1 of the first embodiment is provided with first switching FETs 112 and 114 which serve as the path-selecting switch circuit SW1 as the path-selecting switch on the input side, second switching FETs 122 and 124 which serve as the path-selecting switch circuit SW2 provided on the output side of amplification FET 42 on the interstage side, third switching FETs 132 and 134 which serve as the path-selecting switch circuit SW3 provided on the input side of amplification FET 62 on the interstage side, and fourth switching FETs 142 and 144 which serve as the path-selecting switch circuit SW4 as the path-selecting switch on the output side. The source and drain of each of switching FETs 112, 114, 122, 124, 132, 134, 142 and 144 are not limited to the illustrated embodiment and may be replaced with each other and connected.

Each of amplification FETs 42 and 62 is a source grounded circuit, and the source is directly connected to a reference potential Vss (grounding potential GND in this example). Further, as for the first-stage amplification FET 42 whose source is grounded, its gate is connected in common to each drain of the first switching FETs 112 and 114 through the capacitor 44 for blocking direct-current voltage. Further, a drain of the first-stage amplification FET 42 is connected in common to each drain of the second switching FETs 122 and 124 through a capacitor 46 for blocking direct-current voltage.

In the path-selecting switch circuit SW1, the source of one of first switching FET 112 is connected to an output of the matching circuit 3_1 (input stage matching circuit Mi_1) adjusted to the frequency band FB1 through a capacitor 113 for blocking direct-current voltage. An input of the matching circuit 3_1 is connected to one input terminal 2_1, and the high frequency signal of the frequency band FB1 is inputted. Further, the source of the other first switching FET 114 is connected to an output of the matching circuit 3_2 (input stage matching circuit Mi_2) adjusted to the frequency band FB2 through the capacitor 115 for blocking direct-current voltage. An input of the matching circuit 3_2 is connected to the other input terminal 2_2, and the high frequency signal of the frequency band FB2 is inputted.

In the path-selecting switch circuit SW2, a source of one of second switching FET 122 is connected through a capacitor 123 for blocking direct-current voltage to an input of the matching circuit 5_1 (interstage matching circuit Mm_1) adjusted to the frequency band FB1. Through a capacitor 133 for blocking direct-current voltage, an output of the matching circuit 5_1 is connected to the source of one of the third switching FET 132 which serves as the path-selecting switch circuit SW3.

Further, the source of the other second switching FET 124 is connected to an input of the matching circuit 5_2 (interstage matching circuit Mm_1) adjusted to the frequency band FB2 through a capacitor 125 for blocking direct-current voltage. The output of the matching circuit 5_2 is connected through a capacitor 135 for blocking direct-current voltage to the source of the other third switching FET 134 which serves as the path-selecting switch circuit SW3.

Further, as for the second-stage amplification FET 62 whose source is grounded, its gate is connected in common to each drain of the third switching FETs 132 and 134 through a capacitor 64 for blocking direct-current voltage. Further, a drain of the second-stage amplification FET 62 is connected in common to each drain of the fourth switching FETs 142 and 144 through a capacitor 66 for blocking direct-current voltage.

In the path-selecting switch circuit SW4, the source of one of fourth switching FET 142 is connected through a capacitor 143 for blocking direct-current voltage to an input of the matching circuit 7_1 (output stage matching circuit Mo_1) adjusted to the frequency band FB1. Further, an output of the matching circuit 7_1 is connected to one output terminal 9_1, and the high frequency signal of the frequency band FB1 is outputted.

Further, through a capacitor 145 for blocking direct-current voltage, the source of the other fourth switching FET 144 is connected to an input of the matching circuit 7_2 (output stage matching circuit Mo_2) adjusted to the frequency band FB2. Further, an output of the matching circuit 7_2 is connected to the other output terminal 9_2, and the high frequency signal of the frequency band FB2 is outputted.

In the path-selecting switch circuits SW1-SW4, it is arranged such that the gates of the respective switching FETs 112, 122, 132 and 142 which are on one side and function for the frequency band FB1 side are connected to a first control terminal 8_1 in common and supplied with a switching control signal Ctl1 from a control circuit provided for the mobile communications terminal apparatus (not shown). Further, it is arranged such that the gates of the respective switching FETs 114, 124, 134 and 144 which are on the other side and function for the frequency band FB2 side are connected to a second control terminal 8_2 in common and supplied with a switching control signal Ctl2 from the control circuit provided for the mobile communications terminal apparatus (not shown).

Operation of First Embodiment

The transmission power amplifying circuit 1 having such a structure of the first embodiment is arranged such that when any one of the plural types (two types in this example) of the high frequency signals of the frequency bands FB to be inputted is inputted into the input terminal 2 (2_1, 2_2 in this example), the input stage matching circuit Mi, the interstage matching circuit Mm, and the output stage matching circuit Mo that are most suitable for the any one of the frequency bands FB are selected by the path-selecting switch circuits SW1-SW4, then the inputted signal is amplified in multiple stages in the first-stage amplification FET 42 and the second-stage amplification FET 62 to output the output signal.

In particular, when the high frequency signal of the frequency band FB1 is inputted into the input terminal 2_1, the switching control signal Ctl1 having a voltage of 2.6V is supplied to the first control terminal 8_1, and the switching control signal Ctl2 having a voltage of 0V is supplied to the second control terminal 8_2.

As a result of this, the switching control signal Ctl1 having a voltage of 2.6V is supplied to the gate of each of the switching FETs 112, 122, 132 and 142 which functions on the frequency band FB1 side of each of the path-selecting switch circuits SW1-SW4, whereby each of these FETs is turned ON (in operative state). On the other hand, the switching control signal Ctl2 having a voltage of 0V is supplied to the gate of each of the switching FETs 114, 124, 134 and 144 which functions on the frequency band FB2 side of each of the path-selecting switch circuits SW1-SW4, whereby each of these FETs is turned OFF (in inoperative state).

Thus, the high frequency signal of the frequency band FB1 supplied through the input terminal 2_1 passes through the input stage matching circuit Mi_1 adjusted to the frequency band FB1, and is amplified by the first-stage amplification FET 42. Further, it passes through the interstage matching circuit Mm_1 adjusted to the frequency band FB1, is inputted into the second-stage amplification FET 62, and is amplified by amplification FET 62. Furthermore, it passes through the output stage matching circuit Mo_1 adjusted to the frequency band FB1, and is outputted as the output signal of the frequency band FB1 via the output terminal 9_1.

On the other hand, when the high frequency signal of the frequency band FB2 is inputted into the input terminal 2_2, the switching control signal Ctl1 having a voltage of 0V (for example) is supplied to the first control terminal 8_1, and the switching control signal Ctl2 having a voltage of 2.6V (for example) is supplied to the second control terminal 8_2.

Thus, the switching control signal Ctl1 having a voltage of 0V is supplied to the gate of each of the switching FETs 112, 122, 132 and 142 which functions on the frequency band FB1 side of each of the path-selecting switch circuits SW1-SW4, whereby each of these FETs is turned OFF (in operative state). On the other hand, the switching control signal Ctl2 having a voltage of 2.6V is supplied to the gate of each of the switching FETs 114, 124, 134 and 144 which functions on the frequency band FB2 side of each of the path-selecting switch circuits SW1-SW4, whereby each of these FETs is turned ON (in inoperative state).

Thus, the high frequency signal of the frequency band FB2 supplied via the input terminal 2_2 passes through the input stage matching circuit Mi_2 adjusted to the frequency band FB2, and is amplified by the first-stage amplification FET 42. Further, it is inputted into the second-stage amplification FET 62 through the interstage matching circuit Mm_2 adjusted to the frequency band FB2, and then amplified by the amplification FET 62. Furthermore, it passes through the output stage matching circuit Mo_2 adjusted to the frequency band FB2, and is outputted as the output signal of the frequency band FB2 via the output terminal 9_2.

In this way, with respect to the signals of the plural types of frequency bands FB (two types, FB1 and FB2, in this example), the first-stage amplification FET 42 and the second-stage amplification FET 62 are commonized and amplify them in multiple stages. On the other hand, the matching circuit M adjusted to each frequency band FB is separately provided on the input side, between stages, and on the output side, and the desired path is selected using the path-selecting switch circuit SW, whereby the transmission power amplifying circuit 1 can be operated so that the characteristic may be acquired for each frequency band FB, employing one path of the amplification FETs (amplification FETs 42 and 62 in this example).

In this example, the voltage (switching control signal Ctl1, Ctl2) applied to the gate of each of the switching FETs 112, 122, 132 and 142 of the frequency band FB1 line which serve as the respective path-selecting switch circuits SW1-SW4, or to the gate of each of the switching FETs 114, 124, 134 and 144 of the frequency band FB2 line is set to 0V, to thereby cause the switching FETs ganged together of each frequency band FB line to be inoperative, and control the operation of the transmission power amplifying circuit 1 to the plural types of frequency bands FB so that any one frequency band FB may be passed. However, another arrangement may also be employed, as long as it can pass only one required frequency band FB out of the plural types of frequency bands FB and can control other frequency bands FB to be inoperative.

For example, it is possible to control and stop a power supply which supplies power to each of the switching FETs 112, 122, 132 and 142 of the frequency band FB1 line or each of the switching FETs 114, 124, 134 and 144 of the frequency band FB2 line, to control the switching FETs of any frequency band FB line to be inoperative.

<One-chip Fabrication of Electric Power Amplification Circuit>

The transmission power amplifying circuit 1 of the first embodiment uses a usual high-electron mobility transistor (HEMT) for each of the switching FETs 112, 114, 122, 124, 132, 134, 142, and 144 which serve as the amplification FETs 42 and 62, and the path-selecting switch circuits SW1-SW4, thus realizing a monolithic IC of one chip where they are integrated on a gallium arsenide chip.

More preferably, JP-HEMT having a structure different from the usual high-electron mobility transistor is used so that the transmission power amplifying circuit 1 can be made into a monolithic IC of one-chip integrated on the gallium arsenide chip and can correspond to a single power supply operation.

JP-HEMT means that HEMT realizes higher mobility and higher electron concentration by replacing i-GaAs which constitutes a channel of the usual HEMT with another material which is pseudomorphic. In addition, it is arranged that a positive voltage corresponding to a built-in voltage of a pn junction of AlGaAs may be applied to a gate electrode.

<JP-HEMT>

An example of a structure of JP-HEMT shows that a usual P-HEMT 300B is somewhat modified as can be seen from a comparison between JP-HEMT 300A of the present embodiment as shown in FIG. 6A and the usual(existing) P-HEMT 300B as shown in FIG. 6B.

In other words, firstly, either JP-HEMT 300A of the present embodiment or a usual P-HEMT 300B has a structure in which a buffer layer 302 of an undoped GaAs/AlGaAs, an electron supply layer (doped layer) 304 of a Si-doped n type AlGaAs, a spacer layer 306 of an undoped AlGaAs, an electron transit layer (channel layer) 308 of an undoped InGaAs, a spacer layer 310 of an undoped AlGaAs, and an electron supply layer 312 of a Si-doped n type AlGaAs are epitaxially grown in order on a half-insulation substrate of a compound semiconductor (for example, GaAs) (hereafter referred to as GaAs substrate 301).

Namely, in either of the JP-HEMT 300A or the P-HEMT 300B, it has a double-doped double-heterostructure in which the GaAs substrate 301 has thereon the electron transit layer 308 of undoped InGaAs (as the channel), the electron supply layer 312 of Si-doped n type AlGaAs is provided at the upper part, and the electron supply layer 304 of Si-doped n type AlGaAs is provided at the lower part.

As shown in FIG. 6B, a source and a drain in the usual P-HEMT 300B are such that, on the electron supply layer 312 of Si-doped n-AlGaAs, an ohmic connection layer (cap layer) 322 of n+ type GaAs is positioned and formed, on which a source electrode 324 and a drain electrode 326 are formed.

Further, a gate (electron transit layer) 321 has a recess structure in which a recess is positioned and formed at a part of the electron supply layer 312 of Si-doped n-AlGaAs, where a gate electrode 318 is provided and joined by way of Schottky junction. In this case, the recess structure has caused the on-resistance (indicated by sign of resistance element in the figure) due to an increase in the resistance.

On the other hand, as for the source and drain in the present embodiment, unlike the usual P-HEMT 300B, as shown in FIG. 6A, the ohmic connection layer (cap layer) 322 of n+ type GaAs is positioned and formed on a diffusion layer 314 of AlGaAs where Si is doped at a low concentration or lightly, on which the source electrode 324 and the drain electrode 326 are formed.

Further, as for a gate (electron transit layer) 320 in JP-HEMT 300A, Zn that is of p type impurities is positioned and diffused on the diffusion layer 314 of lightly Si-doped AlGaAs that is formed on the electron supply layer 312 of Si-doped n type AlGaAs, to thereby form a p+ type embedded gate 316, on which the gate electrode 318 is formed.

In other words, as a whole, JP-HEMT 300A has a structure in which a high mobility electron transit layer (electron transit layer 308 of undoped InGaAs) using a hetero-junction boundary is formed between a plurality of semiconductor layers stacked on the GaAs substrate 301, the diffusion layer 314 of slightly Si-doped AlGaAs is formed at one side of the plurality of semiconductor layers, on which impurities are doped to form a gate 320 by way of pn junction and a gate electrode 318 is formed thereon. Further, the source electrode 324 and the drain electrode 326 are formed above the diffusion layer 314 of slightly Si-doped AlGaAs via the ohmic connection layer 322 of n+ type GaAs.

JP-HEMT 300A with such a structure is arranged such that a two-layer 2-dimensional electron gas layer serves as the electron transit layer 308, and the electron supply layers 312 and 304 of Si-doped n-AlGaAs and the electron transit layer 308 are separated. Therefore, factors causing high resistance, such as Coulomb scattering etc. at the time of the electronic transit can be reduced, and it is possible to reduce the on-resistance. Further, since the p+ type embedded gate is formed on the diffusion layer 314 of slightly Si-doped AlGaAs, it is possible to avoid increasing the physical on-resistance due to the recess structure like P-HEMT 300B.

Thus, when JP-HEMT 300A is used for the amplification FETs 42 and 62 of the transmission power amplifying circuit 1, high power (high electric power), high speed, and low power consumption can be attained. Further, when JP-HEMT 300A is used for the path-selecting switch circuit SW, low losses and improvement in the speed can be attained.

Further, as described above, since the p+ type embedded gate 316 is formed, the positive voltage corresponding to the built-in voltage of pn junction of the diffusion layer 314 of slightly Si-doped AlGaAs can be applied to the gate electrode 318, whereby only the positive voltage is applied to the gate electrode 318, and the transmission power amplifying circuit 1 is driven.

Thus, JP-HEMT 300A is used for each switching FET which serves as the amplification FET or the path-selecting switch circuit SW, so that the transmission power amplifying circuit 1 is formed with one chip. Further, since the gate of the transistor may employ pn junction, single positive power supply operation is allowed and peripheral components such as a negative power supply generating circuit may be removed.

It may be possible to use HBT (Heterojunction Bipolar Transistor) instead of each FET (including JP-HMET) to constitute the transmission power amplifying circuit 1. While, HBT can use a positive power supply for a gate electrode in this case, but the path-selecting switch circuit SW is not be formed. Therefore, it is difficult to form the transmission power amplifying circuit 1 with one chip.

Further, it may be possible to use the usual HEMT for each FET in order to construct the transmission power amplifying circuit 1. However, since it is necessary for the usual HEMT to use the negative power supply for the gate electrode when the usual HEMT is used, the negative power supply generating circuit is required in addition to transmission power amplifying circuit 1. Thus, it is inconvenient to construct the whole mobile communications terminal apparatus compactly.

As FET is made into a monolithic IC, the capacitance element C and the inductance element which serve as each matching circuit M (the input stage matching circuit Mi, the interstage matching circuit Mm, and output stage matching circuit Mo) may be made of a pattern capacitor and a spiral inductor which are monolithically formed on a gallium arsenide substrate.

As for the monolithic IC, it may be arranged that a connection port connected to the matching circuit M (or capacitor for blocking direct-current voltage) is provided, and the capacitance element C and the inductance element which serve as each matching circuit M are formed outside the monolithic IC by an external component, wire bonding, ribbon bonding, etc., to thereby monolithically form only FET and the like on the gallium arsenide substrate. In this case, since it is not accompanied with change in IC design, there is an advantage of responding to change of the frequency band FB flexibly.

As described above, in the transmission power amplifying circuit 1 of the first preferred embodiment which embodies the third example of the basic structure as shown in FIG. 3A, the high frequency signals of the plural types of frequency bands FB are amplified in multiple stages by the plural stages of amplification FETs (two stages 42 and 62 in this example) which are commonized. On the other hand, the matching circuit M adjusted to each frequency band FB is provided separately and the desired path is selected using the path-selecting switch circuit SW, whereby the amplification FET for only one path allows the characteristic adapted to each frequency band FB to be obtained, securing the desired amplification factor.

Further, when HEMT is used for FET which serves as the amplification FET and the path-selecting switch circuit SW which constitutes the transmission power amplifying circuit 1, the transmission power amplifying circuit 1 is formed with one chip. When JP-HEMT is used especially as FET, it can be driven with the single power supply, thus the whole mobile communications terminal apparatus may be made compact.

In other words, it is possible to connect with the transmission power amplifying circuit 1, while holding the respective paths (both signal input side and signal output side) provided for the mobile communications terminal apparatus with respect to the respective frequency bands FB, and the respective switches which are to be provided on the mobile communications terminal apparatus, on the signal input side and the signal output side, and for path integration may be taken in the transmission power amplifying circuit 1. In other words, the expansion of transmission system domain and the increase in cost in the mobile communications terminal apparatus may be avoided.

For example, in CDMA system mobile communications, use of the transmission power amplifying circuit 1 of the first embodiment may avoid enlarging the terminal apparatus due to addition of the electric power amplification circuit corresponding to a new frequency band FB for the system change because of carrier frequency reorganization. Further, high prices of terminal apparatus may be avoided.

Second Embodiment

Figure 7:
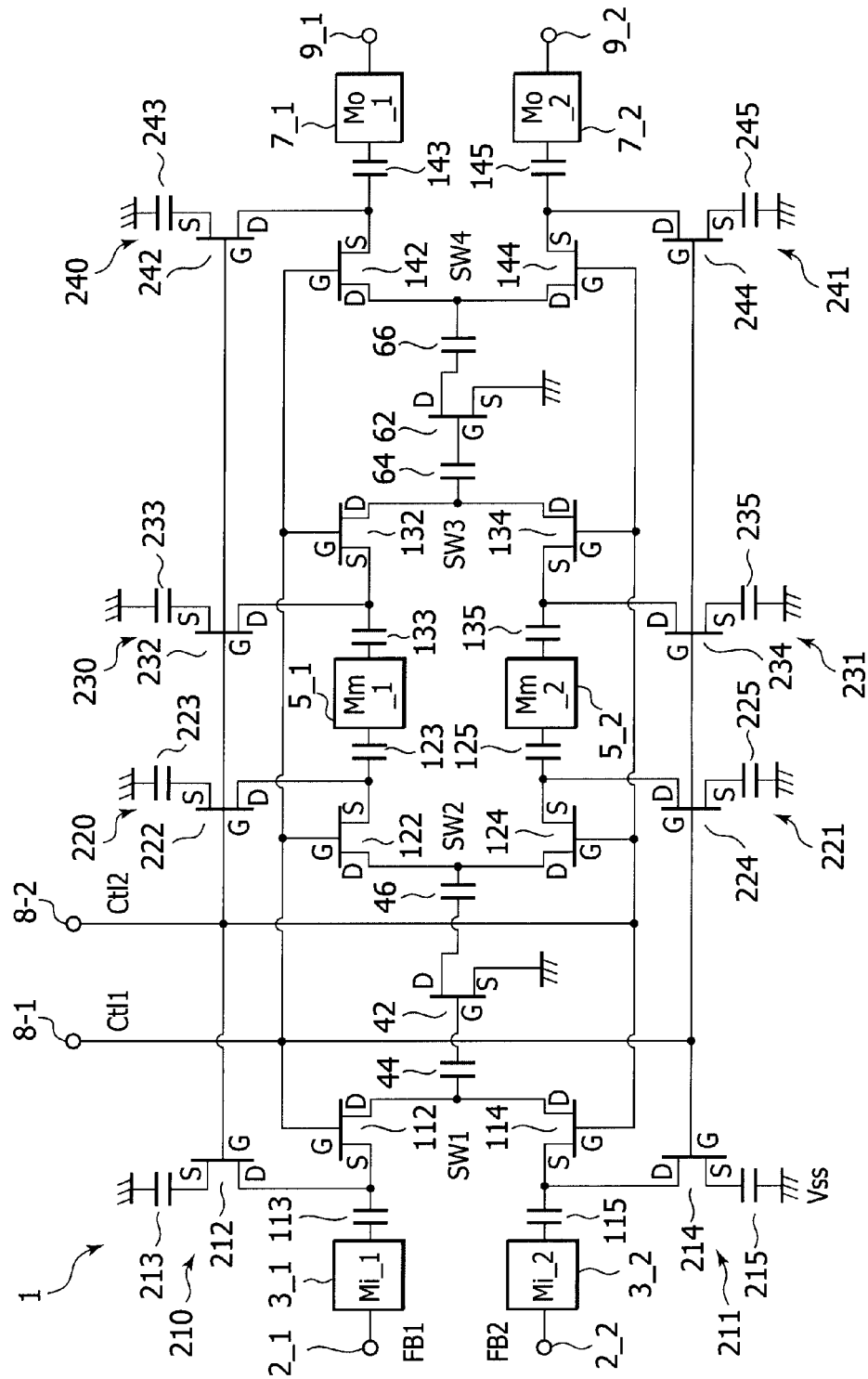
FIG. 7 is a circuit diagram showing a second embodiment of the transmission power amplifying circuit.

FIG. 7 is a circuit diagram showing a second embodiment of an example of a structure of the transmission power amplifying circuit 1. The transmission power amplifying circuit 1 of the second embodiment has a feature that, based on the structure of the first embodiment, an isolation increase circuit (isolation circuit) is added to each path-selecting switch circuit SW as the path-selecting switch.

The isolation increase circuit includes an isolation switch (for example, FET is used) connected to a terminal on a separated band side of the path-selecting switch circuits SW1-SW4. When the respective path-selecting switch circuits SW1-SW4 do not select the signal passing through the terminal, it operates and passes the signal to a path (typically the grounding side) different from an original signal path. Alternatively, when the respective path-selecting switch circuits SW1-SW4 select the signal passing through the terminal on the separated band side, the isolation function is caused to be inoperative.

Based on the structure of the first embodiment, it is natural to get the same effect as the first embodiment, while another effect by the newly added isolation increase circuit may be obtained. Hereafter, differences from the first embodiment will be focused and described.

As shown in FIG. 7, as for the transmission power amplifying circuit 1 of the second embodiment, one of first switching FET 112 which constitutes the path-selecting switch circuit SW1 on the input side is provided with one of first isolation increase circuit 210 having FET 212 for the first isolation increase circuit and a capacitor 213 for blocking direct-current voltage, and the other first switching FET 114 is provided with the other first isolation increase circuit 211 having FET 214 for the first isolation increase circuit and a capacitor 215 for blocking direct-current voltage.

In one of first isolation increase circuit 210, a gate of FET 212 for the first isolation increase circuit is connected to the control terminal 8_2 with which the switching control signal Ctl2 is supplied, the drain is connected to a source of first switching FET 112, and the source is connected to the reference potential Vss (=grounding potential GND) through the capacitor 213 for blocking direct-current voltage.

Similarly, as for the other first isolation increase circuit 211, a gate of FET 214 for the first isolation increase circuit is connected to the control terminal 8_1 with which the switching control signal Ctl1 is supplied, the drain is connected to a source of first switching FET 114, and the source is connected to the reference potential Vss (=grounding potential GND) through the capacitor 215 for blocking direct-current voltage.

Further, one of second switching FET 122 which constitutes the path-selecting switch circuit SW2 between stages is provided with one of second isolation increase circuits 220 having FET 222 for the second isolation increase circuit and a capacitor 223 for blocking direct-current voltage, and the other second switching FET 124 is provided with the other second isolation increase circuits 221 having FET 224 for the second isolation increase circuit and the capacitor 225 for blocking direct-current voltage.

In one of second isolation increase circuit 220, a gate of FET 222 for the second isolation increase circuit is connected to the control terminal 8_2 with which the switching control signal Ctl2 is supplied, the drain is connected to the source of the second switching FET 122, and the source is connected to the reference potential Vss (=grounding potential GND) through the capacitor 223 for blocking direct-current voltage.

Similarly, as for the other second isolation increase circuit 221, a gate of FET 224 for the second isolation increase circuit is connected to the control terminal 8_1 with which the switching control signal Ctl1 is supplied, its drain is connected to the source of the second switching FET 124, and its source is connected to the reference potential Vss (=grounding potential GND) through the capacitor 225 for blocking direct-current voltage.

Further, one of third switching FET 132 which constitutes the path-selecting switch circuit SW3 between stages is provided with one of third isolation increase circuit 230 having FET 232 for the third isolation increase circuit and a capacitor 233 for blocking direct-current voltage, and the other third switching FET 134 is provided with the other third isolation increase circuit 231 having FET 234 for the third isolation increase circuit and a capacitor 235 for blocking direct-current voltage.

In one third isolation increase circuit 230, a gate of FET 232 for the third isolation increase circuit is connected to the control terminal 8_2 with which the switching control signal Ctl2 is supplied, the drain is connected to a source of the third switching FET 132, and the source is connected to the reference potential Vss (=grounding potential GND) through the capacitor 233 for blocking direct-current voltage.

Similarly, in the other third isolation increase circuits 231, a gate of FET 234 for the third isolation increase circuit is connected to the control terminal 8_1 with which the switching control signal Ctl1 is supplied, its drain is connected to a source of the third switching FET 134, and its source is connected to the reference potential Vss (=grounding potential GND) through the capacitor 235 for blocking direct-current voltage.

Further, one fourth switching FET 142 which constitutes the path-selecting switch circuit SW4 on the output side is provided with one of fourth isolation increase circuits 240 having FET 242 for the fourth isolation increase circuit and a capacitor 243 for blocking direct-current voltage. The other fourth switching FET 144 is provided with the other fourth isolation increase circuit 241 having FET 244 for the fourth isolation increase circuit and a capacitor 245 for blocking direct-current voltage.

In one fourth isolation increase circuit 240, a gate of FET 242 for the fourth isolation increase circuit is connected to the control terminal 8_2 with which the switching control signal Ctl2 is supplied, its drain is connected to a source of the fourth switching FET 142, and the source is connected to the reference potential Vss (=grounding potential GND) through the capacitor 243 for blocking direct-current voltage.

Similarly, in the other fourth isolation increase circuit 241, a gate of FET 244 for the fourth isolation increase circuit is connected to the control terminal 8_1 with which the switching control signal Ctl1 is supplied, the drain is connected to a source of the fourth switching FET 144, and the source is connected to the reference potential Vss (=grounding potential GND) through the capacitor 245 for blocking direct-current voltage.

Each of FETs 212, 214, 222, 224, 232, 234, 242, and 244 for the isolation increase circuits functions as a switch where it is turned ON as the gate is moved to H level and it is turned OFF as the gate is moved to L level. At the time of ON, it passes the signal at a drain end to the grounding side, to thereby function to increase the degree of isolation of the switching FETs 112, 114, 122, 124, 132, 134, 142, and 144 to which the path-selecting switch circuits SW1-SW4 correspond. It increases the degree of isolation of the signal of an unselected frequency band, so that operation of the transmission power amplifying circuit 1 may be stabilized.

Operation of Second Embodiment

The transmission power amplifying circuit 1 of such a structure of the second embodiment is arranged such that when the high frequency signal of any one of the plural types (two types in this example) of frequency bands FB to be inputted is inputted into the corresponding input terminals 2 (2_1, 2_2 in this example), the input stage matching circuit Mi, the interstage matching circuit Mm, and the output stage matching circuit Mo that are most suitable for the any one of the frequency bands FB, are selected by means of the path-selecting switch circuits SW1-SW4. After starting the respective isolation increase circuits with respect to the other frequency bands FB side, an inputted signal is amplified in multiple stages by the first-stage amplification FET 42 and the second-stage amplification FET 62 to output an output signal.

Except for the frequency band FB to be processed, the isolation increase circuit increases a degree of isolation more when the switching FET constituting the path-selecting switch circuit SW connected to the isolation increase circuit is OFF. Further, an intrusion of the signal of the frequency band FB to be processed into the path of the other (non-selected one) frequency band FB may be prevented reliably, and then to perform more efficient amplification operation.

On the contrary, the signal of the frequency band FB which is not to be processed and is not selected by the path-selecting switch circuit SW is reliably prevented from leaking into the frequency band FB which is to be processed and is selected by the path-selecting switch circuit SW, as the isolation increase circuit operates at an input/output terminal (terminal on the non-selected matching circuit M side) of the switch.

In particular, when the high frequency signal of the frequency band FB1 is inputted into the input terminal 2_1, the switching control signal Ctl1 having a voltage of, for example, 2.6V is supplied to the first control terminal 8_1, and the switching control signal Ctl2 having a voltage of, for example, 0V is supplied to the second control terminal 8_2.

Thus, the switching control signal Ctl1 having a voltage of 2.6V is supplied also to the gate of each of FETs 214, 224, 234, and 244 for the isolation increase circuits provided for the respective isolation increase circuits 211, 221, 231, and 241 on the frequency band FB2 side, and each of these FETs is turned ON (in operative state), whereby each of the isolation increase circuits 211, 221, 231, and 241 is started (FETs 214, 224, 234, and 244 for the isolation increase circuits are turned ON) to pass the signal on the frequency band FB2 side to the grounding side through the capacitors 215, 225, 235, and 245 for blocking direct-current voltage.

On the other hand, the switching control signal Ctl2 having a voltage of 0V is supplied to the gate of each of FETs 212, 222, 232, and 242 for the isolation increase circuits respectively provided for the isolation increase circuits 210, 220, 230, and 240 on the frequency band FB1 side. As a result, each of these FETs is turned OFF (in inoperative state), so that function of each of the isolation increase circuits 210, 220, 230, and 240 on the frequency band FB1 side is turned OFF.

Therefore, the degree of isolation on the frequency band FB2 side of each of the path-selecting switch circuits SW1-SW4 which have switching FETs 114, 124, 134 and 144 may be increased. It is also possible to reliably prevent the signal of the frequency band FB1 from intruding into the path of the frequency band FB2, and perform more efficient amplification operation.

In addition, as each of the isolation increase circuits 211, 221, 231, and 241 on the frequency band FB2 side operates, the signal of the frequency band FB2 is passed to the grounding side at the input/output terminal of the matching circuit M on the frequency band FB2 side of each of the path-selecting switch circuits SW1-SW4. Thus, even if selectivity of each of the path-selecting switch circuits SW1-SW4 is inferior, it is possible to prevent more reliably the signal of the frequency band FB2 which is not selected by any of the path-selecting switch circuits SW1-SW4 from leaking to the path of the frequency band FB1 which is to be selected.

On the other hand, when the high frequency signal of the frequency band FB2 is inputted into the input terminal 2_2, the switching control signal Ctl1 having a voltage of, for example, 0V is supplied to the first control terminal 8_1, and the switching control signal Ctl2 having a voltage of, for example, 2.6V is supplied to the second control terminal 8_2.

Thus, the switching control signal Ctl2 having a voltage of 2.6V is supplied also to the gate of each of FETs 212, 222, 232, and 242 for the isolation increase circuits respectively provided for the isolation increase circuits 210, 220, 230, and 240 on the frequency band FB1 side. As each of these FETs is turned ON (in operative state), each of the isolation increase circuits 210, 220, 230, and 240 on the frequency band FB1 side is started (FETs 212, 222, 232, and 242 for the isolation increase circuits are turned ON), so that the signal is passed to the grounding side through the capacitors 213, 223, 233, and 243 for blocking direct-current voltage.

On the other hand, the switching control signal Ctl1 having a voltage of 0V is supplied to the gate of each of FETs 214, 224, 234, and 244 for the isolation increase circuits respectively provided for the isolation increase circuits 211, 221, 231, and 241 on the frequency band FB2 side. As a result, each FET is turned OFF (in inoperative state), so that function of each of the isolation increase circuits 211, 221, 231, and 241 on the frequency band FB2 side is stopped.

Thus, the degree of isolation on frequency band FB1 side of each of the path-selecting switch circuits SW1-SW4 having the switching FETs 112, 122, 132 and 142 may be increased. The intrusion of the signal of the frequency band FB2 into the path of the frequency band FB1 may be prevented reliably, and thereby to perform more efficient amplification operation.

In addition, as each of the isolation increase circuits 210, 220, 230, and 240 on the frequency band FB1 side operates, the signal of the frequency band FB1 is passed to the grounding side at the input/output terminal on the matching circuit M side on the frequency band FB1 side of each of the path-selecting switch circuits SW1-SW4. Thus, even if the selectivity of each of the path-selecting switch circuits SW1-SW4 is inferior, it is possible to prevent more reliably the signal of the frequency band FB1 which is not selected by any of the path-selecting switch circuits SW1-SW4 from leaking to the path of the frequency band FB2 which is to be selected.

Third Embodiment

Figure 8:
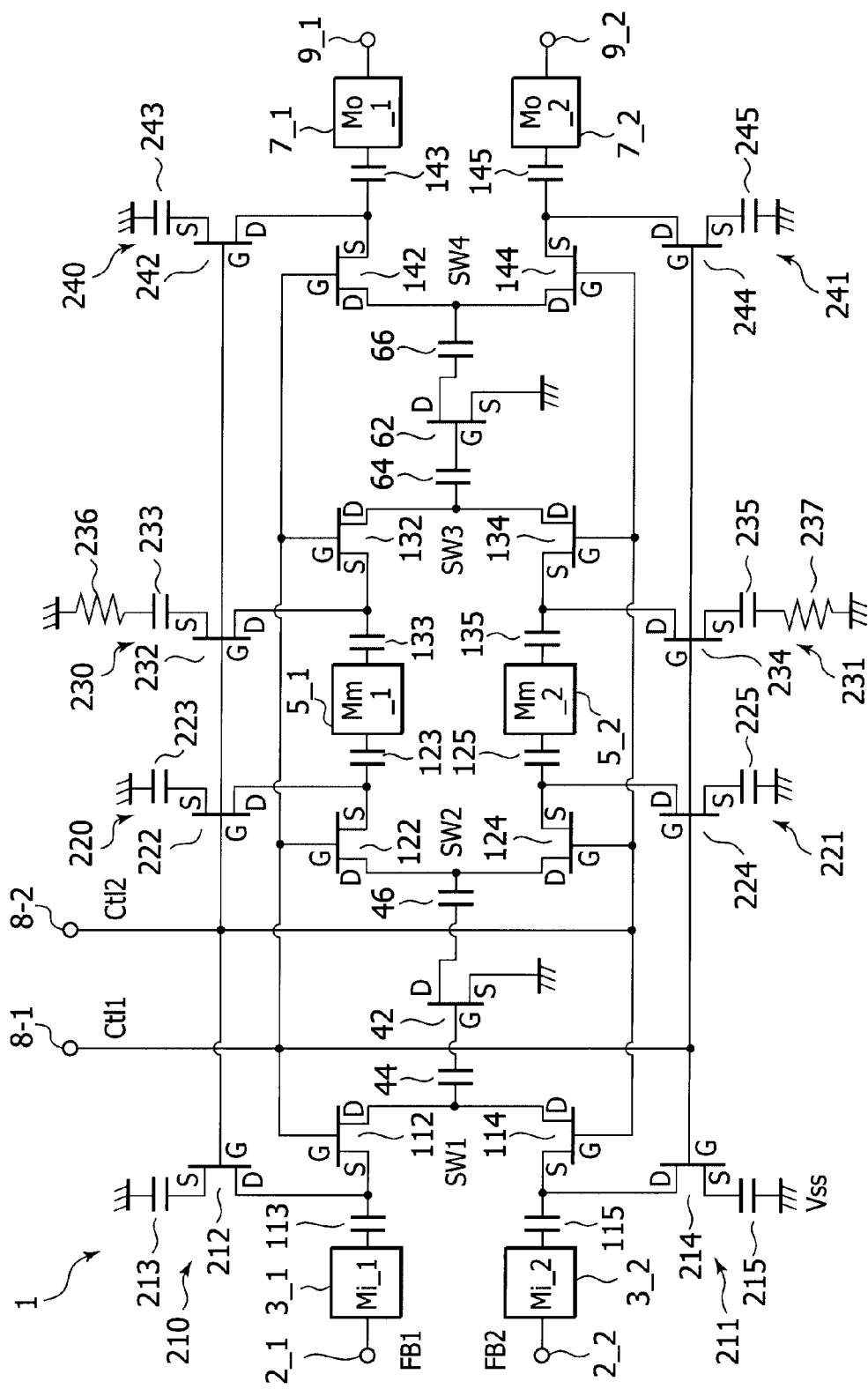
FIG. 8 is a circuit diagram showing a third embodiment of the transmission power amplifying circuit.

FIG. 8 is a circuit diagram showing a third embodiment of an example of a structure of the transmission power amplifying circuit 1. The transmission power amplifying circuit 1 of the third embodiment has a feature that, based on the structure of the second embodiment, an oscillation prevention circuit is added to each isolation increase circuit to the path-selecting switch circuit SW (switch for path selection). Since it is based on the structure of the second embodiment, it is natural to get the same effect as the second embodiment, while another effect by the newly added oscillation prevention circuit may be obtained. Hereafter, differences from the second embodiment will be focused and described.

As for the transmission power amplifying circuit 1 of the third embodiment, the oscillation prevention circuits are added to at least one of the isolation increase circuits 210, 220, 230, and 240 on the frequency band FB1 side, and at least one of the isolation increase circuits 211, 221, 231, and 241 on the frequency band FB2 side (however, it should be paired with one on the frequency band FB1 side). As an example, as shown in FIG. 8, the oscillation prevention circuits using the resistance element for oscillation prevention are provided for the third isolation increase circuits 230 and 231.

As for the oscillation prevention circuit, it is preferable that the circuit provided between the reference potential Vss and the source of FET for the isolation increase circuit which constitutes each isolation increase circuit may be not only the capacitor for blocking direct-current voltage but also a series circuit of the capacitor for blocking direct-current voltage and the resistance element. Since it is the series circuit of the capacitor for blocking direct-current voltage and the resistance element, the order may be either an arrangement in which the source side is provided for the capacitor for blocking direct-current voltage or an arrangement in which the source side is provided for the resistance element.

The example as shown in FIG. 8 employs the former. In other words, a terminating resistor (dumping resistor) 236 for oscillation prevention is provided between the capacitor 233 for blocking direct-current voltage and the reference potential Vss (=grounding potential GND), and a terminating resistor (dumping resistor) 237 for oscillation prevention is provided between the capacitor 235 for blocking direct-current voltage and the reference potential Vss (=grounding potential GND).

Although not shown, the latter is may be employed and arranged such that one terminal of the terminating resistor 236 for oscillation prevention is connected to a source of FET 232 for the third isolation increase circuit, and the other terminal of the terminating resistor 236 is connected to the reference potential Vss (=grounding potential GND) through the capacitor 233 for blocking direct-current voltage, as well as one terminal of the terminating resistor 237 for oscillation prevention is connected to a source of the FET 234 for the third isolation increase circuit, and the other terminal of the terminating resistor 236 is connected to the reference potential Vss (=grounding potential GND) through the capacitor 235 for blocking direct-current voltage.

In any structure, a constant of the terminating resistors 236 and 237 may be approximately 50 ohms, for example.

Operation of Third Embodiment

The transmission power amplifying circuit 1 of the second embodiment as described above and not having the terminating resistors 236 and 237 for oscillation prevention controls the operation of every path-selecting switch circuit SW at the same timing with the switching control signals Ctl1 and Ctl2 from the control circuit provided for the mobile communications terminal apparatus (not shown). Therefore, in the transmission power amplifying circuit 1, operation of turning ON a selected path and operation of turning OFF an unselected path should be performed almost simultaneously.

However, in fact, for example, if a time lag arises in a working speed of each path-selecting switch in the transmission power amplifying circuit 1, there is a possibility that a path may be in an open state and may oscillate momentarily.

For example, when a mobile communications terminal apparatus system switches the frequency from the frequency band FB1 to the frequency band FB2, the switching control signal Ctl1 supplied to the first control terminal 8_1 of the transmission power amplifying circuit 1 switches from 2.6V to 0V, and the switching control signal Ctl2 supplied to the second control terminal 8_2 switches from 0V to 2.6V, whereby each switching FET which constitutes each path-selecting switch circuit SW in the transmission power amplifying circuit 1 operates and the signal path switches from the frequency band FB1 side to the frequency band FB2 side.

At this time, for example, if the switching FETs 122 and 124 of the second path-selecting switch circuit SW2 operate at a working speed faster than switching FETs 132 and 134 of the third path-selecting switch circuit SW3, the path of the third switching FET 134 on the frequency band FB2 side of the third path-selecting switch circuit SW3 is in a momentary open state immediately after the switching. Therefore, the signal of the frequency band FB2 amplified by the first-stage amplification FET 42 passes through the second switching FET 124, flows into the third switching FET 134 side, and is held there. Thus, it may oscillate.

On the other hand, in the structure of the third embodiment which has the terminating resistor 237 for oscillation prevention, the FET 234 for the third isolation increase circuit is turned ON by the switching control signal Ctl1 having a voltage of 2.6V supplied to the first control terminal 8_1. Thus, it is operating so that the path of the third switching FET 134 on the frequency band FB2 side of the third path-selecting switch circuit SW3 may flow into the grounding side through the capacitor 235 for blocking direct-current voltage. At this time, it is terminated by the terminating resistor 237, so that the oscillation as described above may be prevented certainly. This is because the terminating resistor 237 demonstrates a dumping function. Without the terminating resistor 237, the signal of the frequency band FB2 directly flows into the grounding side, thus there is a possibility of oscillation.

Further, for example, when the switching FETs 122 and 124 of the second path-selecting switch circuit SW2 operates at the working speed slower than the switching FETs 132 and 134 of the third path-selecting switch circuit SW3, the path of the third switching FET 132 on the frequency band FB1 side of the third path-selecting switch circuit SW3 is in a momentary open state immediately after the switching. Therefore, the signal of the frequency band FB2 amplified by the first-stage amplification FET 42 passes through the second switching FET 122, flows into the third FET 132 side for switching, and is held there. Thus, an oscillation may occur.

On the other hand, in the structure of the third embodiment which has the terminating resistor 236 for oscillation prevention, FET 232 for the third isolation increase circuit is turned ON by the switching control signal Ctl2 having a voltage of 2.6V supplied to the second control terminal 8_2. Thus, the path of the third switching FET 132 on the frequency band FB1 side of the third path-selecting switch circuit SW3 is switched so that (the signal) may flow into the grounding side through the capacitor 233 for blocking direct-current voltage.

At this time, the terminating resistor 236 terminates the oscillation, so that the oscillation as described above can be prevented with reliability. This is because the terminating resistor 236 exerts a dumping function. Without the terminating resistor 236, the signal of the frequency band FB1 directly flows into the grounding side, thus an oscillation may occur.

It should be noted that, as for the example illustrated here, paying attention to an oscillation phenomenon with respect to a relationship between the second path-selecting switch circuit SW2 and the third path-selecting switch circuit SW3, the example is described in which the resistance elements for oscillation prevention are provided for the third isolation increase circuits 230 and 231 provided for the third path-selecting switch circuit SW only by way of example. However, the resistance elements for oscillation prevention can be provided for the isolation increase circuits disposed in other positions (210/211, 220/221, and 240/241 in this example, where "/" indicates a pair).

Thus, according to the transmission power amplifying circuit 1 of the third embodiment, the oscillation can be prevented with reliability, even if a difference arises between the working speeds of the respective switching FETs which constitute the respective path-selecting switch circuits SW.

Fourth Embodiment

Figure 9:
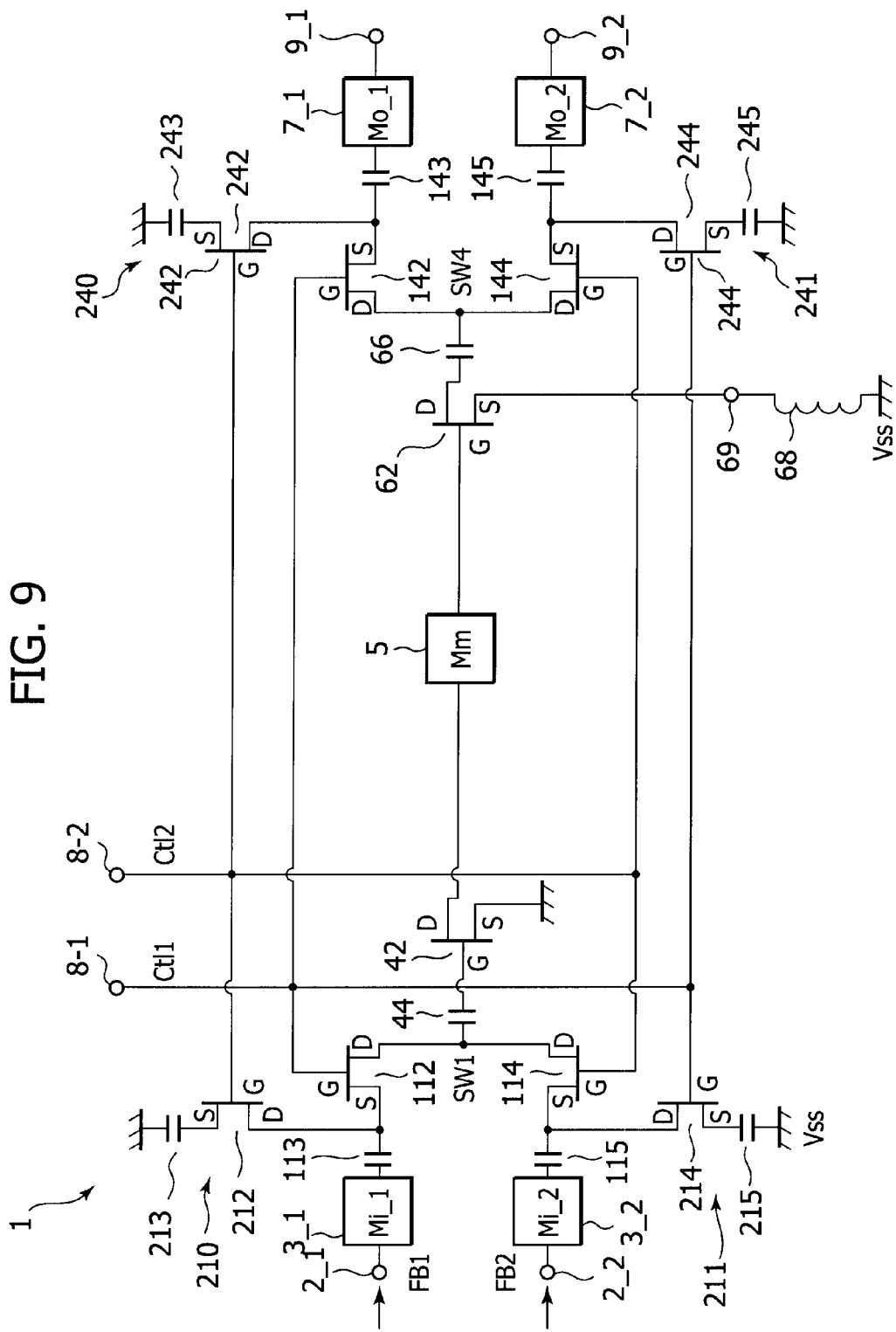
FIG. 9 is a circuit diagram showing a fourth embodiment of the transmission power amplifying circuit.

FIG. 9 is a circuit diagram showing a fourth embodiment of an example of a structure of the transmission power amplifying circuit 1. The transmission power amplifying circuit 1 of the fourth embodiment has a first feature that a negative feedback impedance element (especially one that functions as a resistance component in frequency band FB to be processed) is added to the source side of the amplification FET which constitutes the amplification circuit, to reduce the amplification factor of the source grounding amplifier circuit.

An arrangement of this first feature is applied to the case where the electric power amplifiers AMP are arranged in plural stages, including the first example of the basic structure as shown in FIG. 1B. This is because it is practically difficult for the electric power amplifier AMP of one-stage structure to secure the amplification factor AO required in order to obtain a desired output electric power if the negative feedback element is added to reduce the amplification factor.

As described in the first example of the basic structure, when the electric power amplifiers AMP are arranged in plural stages, it would be convenient that the amplification factors are distributed and set up such that the amplification factor of the electric power amplifier AMP at the former stage for a low signal level is larger than the amplification factor of the electric power amplifier AMP at the latter stage for a high signal level, in order to broaden the band as a whole.

Therefore, it is preferable that the arrangement of the first feature where the negative feedback impedance element is added to the source side of amplification FET to reduce the amplification factor of the electric power amplifier AMP is applied to the electric power amplifier AMP at the latter stage side.

Further, the transmission power amplifying circuit 1 of the fourth embodiment employs the arrangement of the fourth example of the basic structure as shown in FIG. 4A and has a second feature that the one-line interstage matching circuit Mm adapted to the plural types of frequency bands FB is provided between the output side of the first-stage electric power amplifier AMP_1 and the input side of the second-stage electric power amplifier AMP_2.

In other words, the interstage matching circuit Mm_1 on the frequency band FB1 side which functions as an output matching circuit of the first-stage amplification FET 42 and the interstage matching circuit Mm_2 on the frequency band FB2 side in the arrangement of the first—third embodiments are commonized to remove the second path-selecting switch circuit SW2 and the third path-selecting switch circuit SW3.

Since the second path-selecting switch circuit SW2 and the third path-selecting switch circuit SW3 are omitted, the corresponding isolation increase circuits 220, 221, 230, and 231 and the terminating resistors 236 and 237 for oscillation prevention as described in the third embodiment can also be removed.

Although the modification of the second or third embodiment having the isolation increase circuits 210 and 240 is shown in the illustrated example, it may also be applied as a modification of the first embodiment which is not provided with the isolation increase circuits 210 and 240. Hereafter, differences from the first—third embodiments will be focused and described.

The transmission power amplifying circuit 1 of the fourth preferred embodiment is arranged such that the source of the second-stage amplification FET 62 is connected to the reference potential Vss (=grounding potential GND) through the inductance element or resistance element which is an example of the negative feedback impedance element. As the resistance component is provided on the source side of the amplification FET 62 for negative feedback, the amplification factor of the electric power amplifier AMP can be reduced to that less than the intact amplification factor Amax.

For example, as shown in FIG. 9, the transmission power amplifying circuit 1 of the fourth embodiment is provided with the inductance element (inductor) 68 as the negative feedback impedance element. When the inductance element 68 is used, in fact, the frequency band FB to be processed has the element constants to the extent that it functions as the resistance component. As an example, when the center frequency FB0 of the frequency band FB is around 1 GHz (gigahertz), this inductance element 68 has an inductance of the order of a few tenths of an nH.

In this case, the inductance element 68 may be basically formed of a bonding member connected between the source of the second-stage amplification FET 62 and the reference potential (in this example, grounding potential) by way of wire bonding, ribbon bonding, or the like, for example. Therefore, it is not particularly necessary to be constituted by a spiral inductor monolithically formed on the gallium arsenide substrate and the external component. It may be formed such that a connection terminal 69 is provided on the source side of the amplification FET 62, and only the bonding is carried out between the terminal and the grounding. This point is a significant advantage, while it is necessary to positively provide the resistance element between the connection terminal 69 and the grounding in the case where the resistance element is used as the impedance element.

Further, as shown in FIG. 9, it is assumed that in the transmission power amplifying circuit 1 of the fourth embodiment, one interstage matching circuit Mm is used between stages which is adapted to the plural types of frequency bands FB. Accordingly, the path-selecting switch circuits SW2 and SW3 and the isolation increase circuits 220, 221, 230, and 231, and the terminating resistors 236 and 237 are removed. The matching circuit 5 (interstage matching circuit Mm) is common to the signals of the plural types of frequency bands FB1 and FB2.

Further, the capacitors 123 and 125 for blocking direct-current voltage provided on the output side of the path-selecting switch circuit SW2 and the capacitors 133 and 135 for blocking direct-current voltage provided on the input side of the path-selecting switch circuit SW3 are removed.

Further, since the interstage matching circuit Mm itself has the capacitance element C with a direct-current blocking function, the capacitor 46 for blocking direct-current voltage provided on the output side of the first-stage amplification FET 42 and the capacitor 64 for blocking direct-current voltage provided on the input side of the second-stage amplification FET 62 are also removed, and the input side of the interstage matching circuit Mm is directly connected to the drain of the first-stage amplification FET 42, as well as the output side of the interstage matching circuit Mm is directly connected to the gate of the second-stage amplification FET 62.

Operation of Fourth Embodiment

The transmission power amplifying circuit 1 having such an arrangement of the fourth embodiment connects the negative feedback impedance element (inductance element 68 in this example) to the source of the second-stage amplification FET 62 in series and grounds it. Thus, it is possible to reduce frequency dependency of impedance-matching (especially, input impedance of amplification FET 62) between stages. As a result, the interstage matching circuit Mm is common to the signals of the plural types of frequency bands FB to be inputted. Therefore, the path-selecting switch circuits SW2 and SW3 required when the interstage matching circuit Mm operates for each band may be removed.

For example, when an impedance required in order that the first-stage amplification FET 42 may perform amplification to obtain a desired characteristic and the output is obtained by converting the input impedance of the second-stage amplification FET 62 by means of the interstage matching circuit Mm, the source of the second-stage amplification FET 62 which is grounded via the impedance element (inductance element 68 in this example) can realize the impedance less dependent on the frequency than the source of the second-stage amplification FET 62 which is directly grounded not via the impedance element (inductance element 68 in this example).

As a result, when one interstage matching circuit Mm of interstage is employed, a performance margin at the time of adjusting it to the plural types of frequency bands FB is increased. Therefore, it is easy to realize a commonality of the interstage matching circuit Mm_1 for frequency band FB1 and the interstage matching circuit Mm_2 for frequency band FB2 (which are interposed between stages in the first—the third embodiments) into one interstage matching circuit Mm. Accordingly, the path-selecting switch circuits SW2 and SW3 and the corresponding capacitors 46, 123, 125, 135, 133, 135, and 64 for blocking direct-current voltage may be removed. As a whole, it is possible to considerably decrease the number of components, reduce the scale of the transmission power amplifying circuit 1, and reduce in size and in costs.

Further, fundamentally, since the inductance element 68 used as an example of the impedance element can be formed by way of wire bonding, ribbon bonding, etc., for example, it is not particularly necessary to be constituted by the spiral inductor which is monolithically formed on the gallium arsenide substrate and the external components. Therefore the inductance element 68 can be arranged outside the monolithic IC. In this case, the inductance element 68 is connected to the source of amplification FET 62 through the connection terminal 69 as described above.

When the inductance element 68 is provided on the source side of the second-stage amplification FET 62, it is not necessary to enlarge the chip size of the transmission power amplifying circuit 1 where the principal part (electric power amplifier AMP and path-selecting switch circuit SW in this example) is constituted by the monolithic IC.

The arrangement where the negative feedback impedance element is added to the source side of the amplification FET to reduce the amplification factor of the electric power amplifier AMP can also be applied to the first-stage amplification FET 42. For example, a source grounding part of the amplification FET 42 by wire bonding etc. may be formed.

However, as described above, in the transmission power amplifying circuit 1 as a whole, in order to secure the amplification factor A0 required to obtain the certain desired output electric power, it is preferable that the arrangement where the negative feedback impedance element is added to the source side of amplification FET to reduce the amplification factor of the electric power amplifier AMP is applied to the electric power amplifier AMP (second-stage amplification FET 62 in this example) at the latter stage side. Further, with respect to the electric power amplifier AMP (first-stage amplification FET 42 in this example) at the former stage side, it is preferable that the resistance component in the frequency band FB to be processed on the source side is as small as possible.

In order to reduce the resistance component on the source side of the first-stage amplification FET 42 as small as possible, it is preferable that the source grounding part of the amplification FET 42 is connected to the reference potential Vss by means of a via hole (Via Hole) so as to generate a component of the impedance element (resistance element or inductance element) as little as possible.

As shown in FIG. 9, the transmission power amplifying circuit for communication terminals is arranged to be capable of being supplied with the signals of the plural types of frequency bands, and is provided with the amplification circuit in which the inputted signal of each of the frequency bands FB1 and FB2 is amplified and outputted by a common active element. In other words, the active element for electric power amplification is common to the signals of the plural types of frequency bands. On the input side and output side, the matching circuits M and Mo are disposed which match impedances with a connected circuit. The two-stage structure of the amplification FETs 42 and 62, in which the source of the second-stage amplification FET 62 is grounded (GND) by wire bonding etc., and the interstage matching circuit Mm is common to the signals of the plural types of frequency bands. Thus, the electric power amplification for an 800 MHz band, for example, and the existing 900 MHz band can be realized with a simple structure.

Fifth Embodiment

Figure 10:
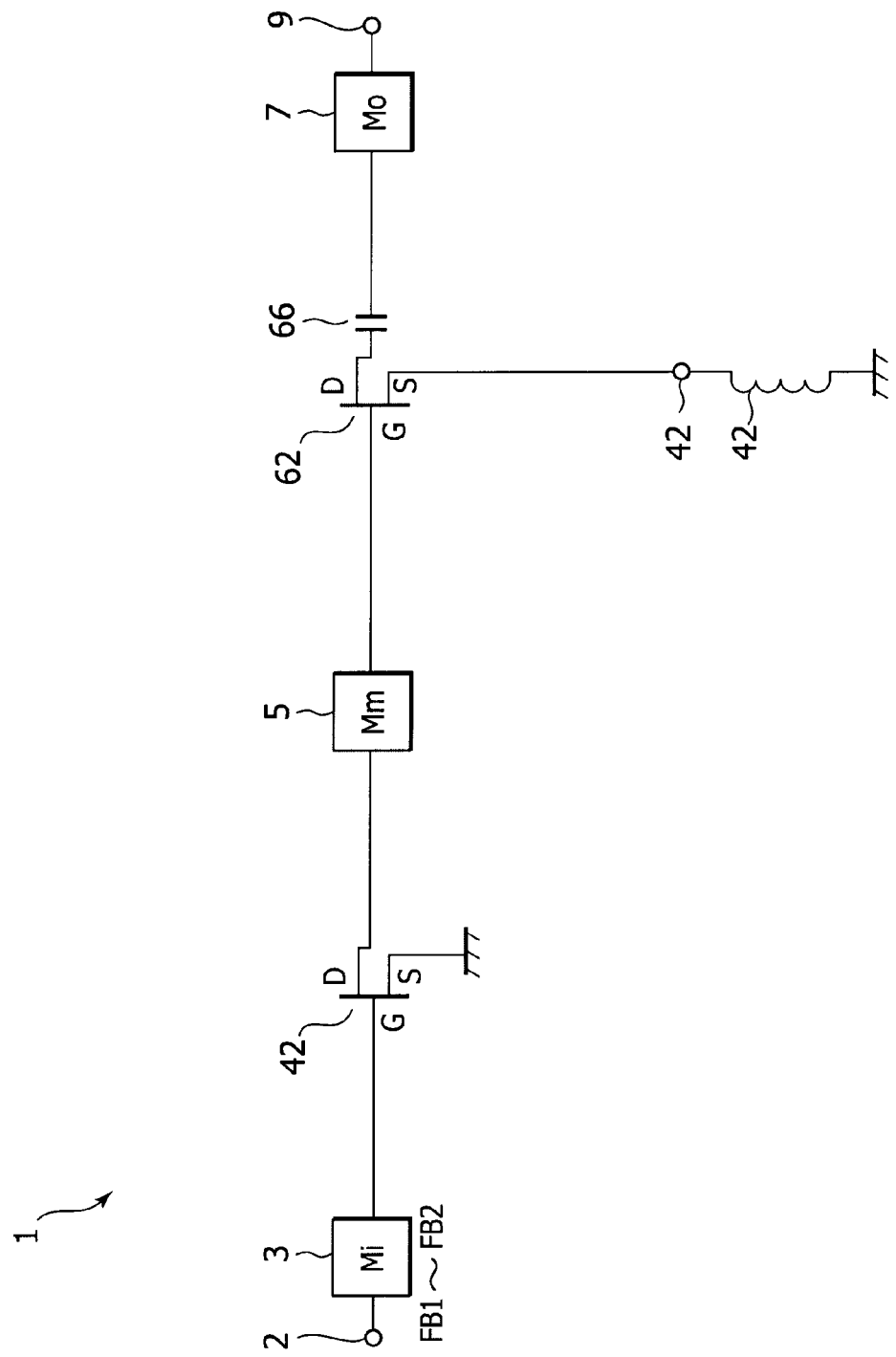
FIG. 10 is a circuit diagram showing a fifth embodiment of the transmission power amplifying circuit.

FIG. 10 is a circuit diagram showing a fifth embodiment of a specific example of a structure of the transmission power amplifying circuit 1. The transmission power amplifying circuit 1 of the fifth embodiment further develops the structure of the fourth embodiment, and respectively provides the input stage matching circuit Mi and the output stage matching circuit Mo which are of one single-line and adapted to the plural types of frequency bands FB for the respective matching circuits M on the input side and the output side, thus having a feature of using the structure of the first example of the basic structure as shown in FIG. 1B.

In other words, the input stage matching circuit Mi_1 on the frequency band FB1 side and the input stage matching circuit Mi_2 on the frequency band FB2 side in the structure of the fourth embodiment as described above realizes a commonality (integrated into one). The output stage matching circuit Mo_1 on the frequency band FB1 side and the output stage matching circuit Mo_2 on the frequency band FB2 side also realize a commonality. Further, the first path-selecting switch circuit SW1 and the fourth path-selecting switch circuit SW4 are omitted.

For example, as shown in FIG. 10, since one input stage matching circuit Mi is used for the plural types of frequency bands FB, one input terminal 2 is used for the plural types of frequency bands FB. Similarly, one output stage matching circuit Mo is used for the plural types of frequency bands FB. Thus, one output terminal 9 is also used for the plural types of frequency bands FB.

Further, since the first path-selecting switch circuit SW1 and the fourth path-selecting switch circuit SW4 are omitted, the corresponding isolation increase circuits 210, 211, 240, and 241, the capacitors 113 and 115 for blocking direct-current voltage provided on the input side of the path-selecting switch circuit SW1, and the capacitors 143 and 145 for blocking direct-current voltage provided on the output side of the path-selecting switch circuit SW4 are removed.

Further, since the input stage matching circuit Mi itself has the capacitance element C with the direct-current blocking function, the capacitor 44 for blocking direct-current voltage provided on the input side of the first-stage amplification FET 42 is removed, and the output side of the input stage matching circuit Mi is directly connected to the gate of the first-stage amplification FET 42.

Further, since the output stage matching circuit Mo itself has the capacitance element C with the direct-current blocking function, the capacitor 66 for blocking direct-current voltage provided on the output side of the second-stage amplification FET 62 is removed, and the input side of the output stage matching circuit Mo is directly connected to the drain of the second-stage amplification FET 62.

Operation of Preferred Embodiment

In the structure of the fourth embodiment (applicable also to the first-third embodiments), as for the signal input side, when the input stage matching circuit Mi for each frequency band FB converts an input load impedance by means of the input stage matching circuit Mi and obtains an impedance required in order that the first-stage amplification FET 42 may perform amplification to obtain the desired characteristic and the output, it can be realized by broadening the bands only by means of one input stage matching circuit Mi in the case where the frequency band FB1 and the frequency band FB2 are relatively narrow bands.

Namely, if one input stage matching circuit Mi is used on the input side, when the plural types of frequency bands FB (frequency band FB1 and frequency band FB2 in this example) are relatively narrow bands, the performance margin at the time of fitting to the plural types of the frequency band FB is large. Therefore, in the fourth embodiment (also applicable to first to third embodiments), it is easy to realize a commonality the input stage matching circuit Mi_1 for frequency band FB1 and the input stage matching circuit Mi_2 for the frequency band FB2 which are interposed at the signal input side into one input stage matching circuit Mi.

Since the input stage matching circuit Mi is of one single-line, the plural types of frequency bands FB (frequency band FB1 and frequency band FB2) are supplied from one input terminal 2 with respect to the signal of either of the frequency bands FB, pass through a path where one matching circuit 3 (input stage matching circuit Mi) converts the input load impedance into the desired impedance over the broadened bands, and are supplied to the first-stage amplification FET 42 However, in such an arrangement, it is taken into consideration that the input stage matching circuit Mi may not greatly influence the amplification FET 42 to perform the amplification to obtain the desired characteristic and the output.

Thus, when the plural types of frequency bands FB to be processed are relatively narrow band, it is easy to realize a commonality of the matching circuits M (input stage matching circuits Mi) on the input side which are adapted to the plural types of frequency bands FB, and one input stage matching circuit Mi can be arranged on the signal input side of the first-stage amplification FET 42. Accordingly, the first path-selecting switch circuit SW1 and the corresponding capacitors 44, 113, and 115 for blocking direct-current voltage can also be removed. As a whole, it is possible to considerably decrease the number of components, reduce the scale of the transmission power amplifying circuit 1, and reduce in size and in costs.

Further, the same applies to the signal output side. In other words, as for the output stage matching circuit Mo for each frequency band FB used in the structure of the fourth embodiment (also applicable to first to third embodiments), when the impedance required in order that the second-stage amplification FET 62 may perform the amplification to obtain a desired characteristic and the output is obtained by converting an output load impedance by means of the output stage matching circuit Mo, it may be realized by broadening the bands by means of only one output stage matching circuit Mo in the case where the frequency band FB1 and the frequency band FB2 are relatively narrow bands.

In other words, if one output stage matching circuit Mo on the output side is used, when the plural types of frequency bands FB (frequency band FB1 and frequency band FB2 in this example) are relatively narrow bands, the performance margin at the time of fitting to the plural types of the frequency band FB is large. Therefore, in the fourth embodiment (also applicable to first to third embodiments), it is easy to realize a commonality of the output stage matching circuit Mo_1 for frequency band FB1 and the output stage matching circuit Mo_2 for the frequency band FB2 which are interposed at the signal output side into one output stage matching circuit Mo.

Since the output stage matching circuit Mo is of one single-line, the plural types of frequency bands FB (frequency band FB1 and frequency band FB2) amplified by an amplification factor AO required by the first-stage amplification FET 42 and the second-stage amplification FET 62, with respect to either of the signal of which frequency bands FB, pass through a path where one matching circuit 7 (output stage matching circuit Mo) converts the output load impedance into a desired impedance for the broadband, and are outputted via one output terminal 9.

However, in such an arrangement, it is taken into consideration the broadening of the impedance by way of resonance of the inductance element (inductor) L and the capacitance element (capacitor) in the case where the output stage matching circuit Mo is formed to be of a relatively large scale.

Thus, when the plural types of frequency bands FB to be processed are relatively narrow bands, it is easy to realize a commonality of the matching circuits M (output stage matching circuits Mo) on the output side adapted to the plural types of frequency bands FB, and one output stage matching circuit Mo may be arranged on the signal output side of the second-stage amplification FET 62. Accordingly, the fourth path-selecting switch circuit SW4 and the corresponding capacitors 66, 143, and 145 for blocking direct-current voltage can also be removed. As a whole, it is possible to considerably decrease the number of components, reduce the scale of the transmission power amplifying circuit 1, and reduce in size and in costs.

In the structure of the fifth embodiment as shown in FIG. 10, although one matching circuit M adapted to the plural types of frequency bands FB is used for each of the input stage matching circuit Mi and the output stage matching circuit Mo to carry out the commonization (integration), either one may be provided for every frequency band FB. In view of the size and the balance of the characteristic of the transmission power amplifying circuit 1 as a whole, it may be determined whether each of the matching circuits M on the input and output sides is independent or common to the plural types of frequency bands FB.

Sixth Embodiment

Figure 11:
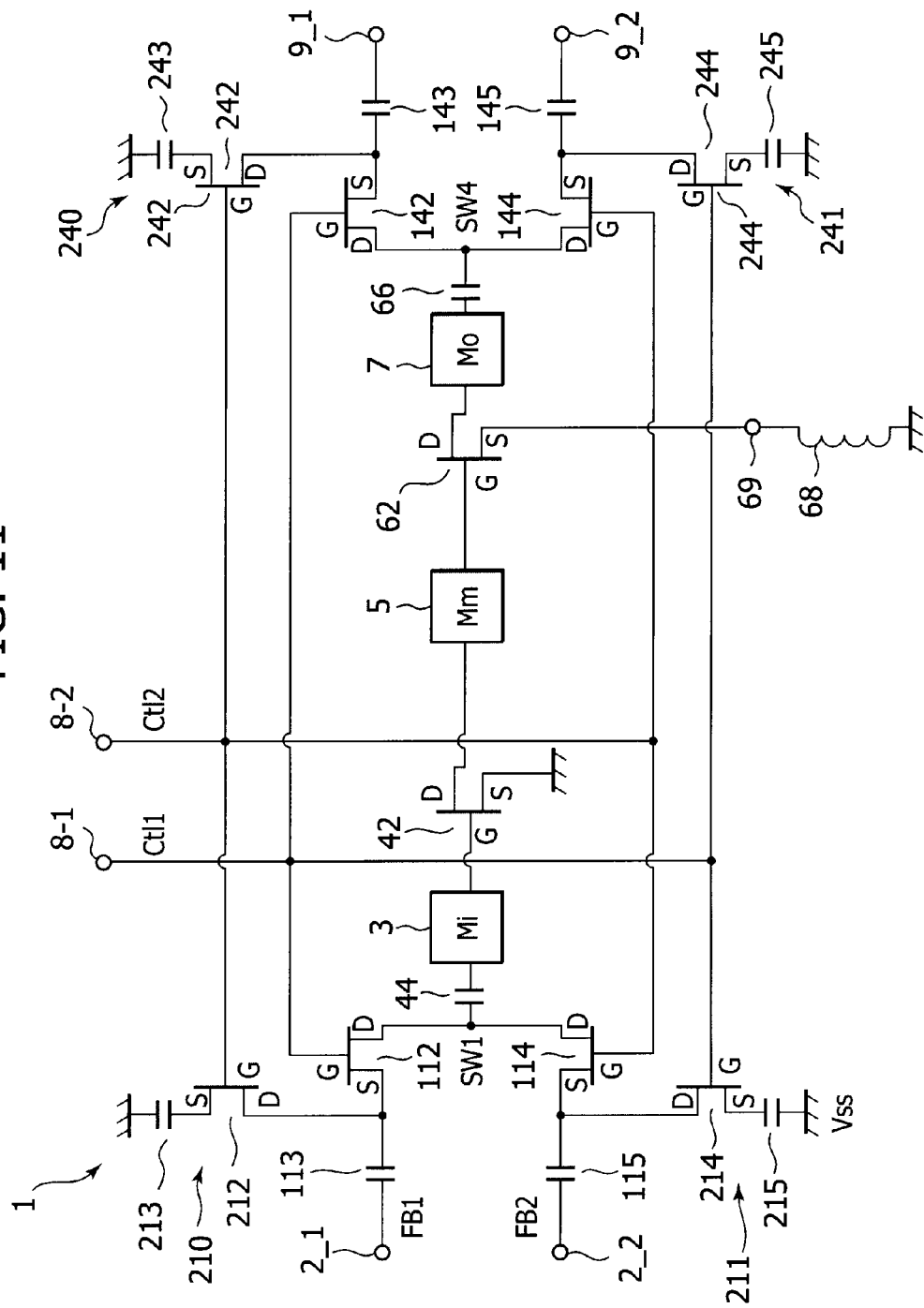
FIG. 11 is a circuit diagram showing a sixth embodiment of the transmission power amplifying circuit.

FIG. 11 is a circuit diagram showing a sixth embodiment of a specific example of a structure of the transmission power amplifying circuit 1. Based on the structure of the fourth embodiment where the negative feedback impedance element is added to the source side of the amplification FET which constitutes the amplification circuit so as to reduce the amplification factor and the one-line interstage matching circuit Mm adapted to the plural types of frequency bands FB is provided for the matching circuit M between the stages, the transmission power amplifying circuit 1 of the sixth embodiment has a feature that, with respect to the signal input side and the signal output side, the arrangement order of the path-selecting switch circuit SW and the matching circuit M is reversed, thus employing the structure of the fourth example of the basic structure as shown in FIG. 4B.

In other words, the path-selecting switch circuit SW1 on the input side of the first-stage amplification FET 42 is on the signal input side of the input stage matching circuit Mi, and the path-selecting switch circuit SW4 on the output side of the second-stage amplification FET 62 is on the signal output side of the output stage matching circuit Mo.

In particular, as shown in FIG. 11, firstly with respect to the signal input side, the gate of the first-stage amplification FET 42 whose source is grounded is connected to the output of one matching circuit 3 (input stage matching circuit Mi) adapted to the plural types of frequency bands FB (frequency bands FB1 and FB2 in this example).

The input of the matching circuit 3 is connected in common to the drain of each of the first switching FETs 112 and 114 of the path-selecting switch circuit SW1 via the capacitor 44 for blocking direct-current voltage.

In the path-selecting switch circuit SW1, the source of one first switching FET 112 is connected to one the input terminal 2_1 through the capacitor 113 for blocking direct-current voltage, and the high frequency signal of the frequency band FB1 is inputted. Further, the source of the other first switching FET 114 is connected to the other input terminal 2_2 through the capacitor 115 for blocking direct-current voltage, and the high frequency signal of the frequency band FB2 is inputted.

Further, as with the second-fourth embodiments, the first isolation increase circuits 210 and 211 are respectively connected to the sources of the first switching FETs 112 and 114.

Further, with respect to the signal output side, the drain of the second-stage amplification FET 62 whose source is grounded through the inductance element 68 is connected to the input of one matching circuit 7 (output stage matching circuit Mo) adapted to the plural types of frequency bands FB (frequency bands FB1 and FB2 in this example).

The output of the matching circuit 7 is connected in common to the drain of each of the fourth switching FETs 142 and 144 of the path-selecting switch circuit SW4 via the capacitor 66 for blocking direct-current voltage.

In the path-selecting switch circuit SW4, the source of one fourth switching FET 142 is connected to one output terminal 9_1 through the capacitor 143 for blocking direct-current voltage, and the high frequency signal of the frequency band FB1 is outputted. Further, the source of the other fourth switching FET 144 is connected to the other output terminal 9_2 through the capacitor 145 for blocking direct-current voltage, and the high frequency signal of the frequency band FB2 is outputted.

Further, as with the second-fourth embodiments, the fourth isolation increase circuits 240 and 241 are respectively connected to the sources of the fourth switching FETs 142 and 144.

Further, in the path-selecting switch circuits SW1 and SW4, it is arranged that the gates of the respective switching FETs 112 and 142 which are on one side and function for the frequency band FB1 side are connected to the first control terminal 8_1 in common, and supplied with the switching control signal Ctl1 from the control circuit provided for the mobile communications terminal apparatus (not shown). Further, it is arranged such that the gates of the respective switching FETs 114 and 144 which are on the other side and function for the frequency band FB2 side are connected to the second control terminal 8_2 in common and supplied with the switching control signal Ctl2 from the control circuit provided for the mobile communications terminal apparatus (not shown).

Although the modification of the second or third embodiment having the isolation increase circuits 210 and 240 is shown in the illustrated example, it may also be applied as a modification of the first embodiment which is not provided with the isolation increase circuits 210 and 240.

Operation of Sixth Embodiment

The transmission power amplifying circuit 1 having such a structure of the sixth embodiment is arranged such that when any one of the high frequency signals of the plural types (two types in this example) of frequency bands FB to be inputted is inputted into the corresponding input terminal 2 (2_1, 2_2 in this example), it is inputted into the input stage matching circuit Mi and the output stage matching circuit Mo which are adapted to both the frequency bands FB1 and FB2 in the path-selecting switch circuits SW1 and SW4, then the inputted signal is amplified in multiple stages by the first-stage amplification FETs 42 and the second-stage amplification FET 62 to output the output signal.

In particular, when the high frequency signal of the frequency band FB1 is inputted into the input terminal 2_1, the switching control signal Ctl1 having a voltage of, for example, 2.6V is supplied to the first control terminal 8_1, and the switching control signal Ctl2 having a voltage of, for example, 0V is supplied to the second control terminal 8_2.

Thus, the switching control signal Ctl1 having a voltage of 2.6V is supplied to the gates of the respective switching FETs 112 and 142 which function for the frequency band FB1 side of the respective path-selecting switch circuits SW1 and SW4, each of these FETs is turned ON (in operative state). While, the switching control signal Ctl2 having a voltage of 0V is supplied to the gates of the respective switching FETs 114 and 144 which function on the frequency band FB2 side of the respective path-selecting switch circuits SW1 and SW4, and each of these FETs is turned OFF (in inoperative state).

Thus, the high frequency signal of the frequency band FB1 supplied via the input terminal 2_1 passes through the input stage matching circuit Mi, and is amplified by the first-stage amplification FET 42. Further, it is inputted into the second-stage amplification FET 62 through the interstage matching circuit Mm, and amplified by the amplification FET 62. Furthermore, it passes through the output stage matching circuit Mo, and is outputted as the output signal of the frequency band FB1 via the output terminal 9_1.

On the other hand, when the high frequency signal of the frequency band FB2 is inputted into the input terminal 2_2, the switching control signal Ctl1 having a voltage of, for example, 0V is supplied to the first control terminal 8_1, and the switching control signal Ctl2 having a voltage of, for example, 2.6V is supplied to the second control terminal 8_2.

Thus, the switching control signal Ctl1 having a voltage of 0V is supplied to the gates of the respective switching FETs 112 and 142 which function for the frequency band FB1 side of the respective path-selecting switch circuits SW1 and SW4, and each of these FETs is turned OFF (in inoperative state). While, the switching control signal Ctl2 having a voltage of 2.6V is supplied to the gates of the respective switching FETs 114 and 144 which function for the frequency band FB2 side of the respective path-selecting switch circuits SW1 and SW4, and each of these FETs is turned ON (in operative state).

Thus, the high frequency signal of the frequency band FB2 supplied via the input terminal 2_2 passes through the input stage matching circuit Mi and is amplified by the first-stage amplification FET 42. Further, it is inputted into the second-stage amplification FET 62 through the interstage matching circuit Mm, and amplified by the amplification FET 62. Furthermore, it passes through the output stage matching circuit Mo, and is outputted as the output signal of the frequency band FB2 via the output terminal 9_2.

Thus, the first-stage amplification FET 42 and the second-stage amplification FET 62 are common to the signals of the plural types of frequency bands FB (two types, FB1 and FB2 in this example) and amplify the signals in multiple stages. On the other hand, one matching circuit M adapted to the plural types of frequency bands FB is each provided for the input side and output side and between stages, the desired path is selected by means of the path-selecting switch circuit SW, whereby the transmission power amplifying circuit 1 can be operated so that the characteristic may be obtained by each frequency band FB, employing only one path of the amplification FETs (amplification FETs 42 and 62 in this example).

In this way, as with the first embodiment, it is possible to connect with the transmission power amplifying circuit 1, while holding the respective paths (both signal input side and signal output side) provided for the mobile communications terminal apparatus with respect to the respective frequency bands FB. The respective switches which are to be provided on the mobile communications terminal apparatus, which are on the signal input side and the signal output side, and which are for path integration can be taken in the transmission power amplifying circuit 1. In other words, an expansion of the transmission system domain and the increase in cost in the mobile communications terminal apparatus may be avoided.

Further, both the input stage matching circuit Mo and the output stage matching circuit Mo are not provided for each frequency band FB, but one input stage matching circuit Mi and one output stage matching circuit Mo are arranged to adapt to the plural types of frequency bands FB. Therefore, each of the input stage matching circuit Mi and the output stage matching circuit Mo is constituted by one single-line as in the case with the electric power amplifier AMP, so that there is an advantage of reducing the circuit scale.

Further, in the illustrated structure, as with the second-fourth embodiments, the isolation increase circuits 210, 211, 240, and 241 are provided. Thus, with respect to those other than the frequency band FB to be processed, the isolation increase circuits 210, 211, 240, and 241 are started so that the degree of the isolation of the isolation increase circuits FETs 212, 214, 242, and 244 which constitute the path-selecting switch circuits SW1 and SW2 connected to the isolation increase circuits 210, 211, 240, and 241 can be raised more. Further, it is possible to reliably prevent the frequency band FB to be processed from intruding into the path of the other frequency band FB, and more efficient amplification operation can be performed.

In these examples, the voltage (switching control signal Ctl1, Ctl2) applied to the gates of the respective switching FETs 112 and 142 of the frequency band FB1 line which serve as the respective path-selecting switch circuits SW1 and SW4, or the gates of the respective switching FETs 114 and 144 of the frequency band FB2 line is set to 0V, to thereby cause the switching FETs of each frequency band FB line to be inoperative at a time, and control the operation of the transmission power amplifying circuit 1 to the plural types of frequency bands FB so that any one frequency band FB may be passed. However, another arrangement may also be employed, as long as it can pass only one required frequency band FB out of the plural types of frequency bands FB and can control other frequency bands FB to be inoperative. This point is similar to the description of the first embodiment.

As describe above, although examples of the present invention is described with reference to exemplary embodiments, the technical scope of the present invention is not limited to the described range of the above-mentioned embodiments. Various changes or improvement can be added to the above-described preferred embodiments according to circuit design etc. without departing from the scope of the invention, and the thus changed and improved embodiment is also included in the technical scope of the present invention.

Further, the above-described embodiments do not limit the invention according to claims. Furthermore, not all the combinations of the features described with reference to the embodiments are necessarily indispensable for the solution means of the invention. The inventions of various stages are included in the preferred embodiments as described above, and various inventions can be derived by way of a suitable combination in a plurality of disclosed constituent elements. Even if some constituent elements are deleted out of the whole constituent elements as illustrated in the embodiments, as long as the effect is acquired, a structure from which some of these constituent elements are deleted may be extracted as the invention.

The present application claims benefit of priority of Japanese patent Application No. 2006-266300 filed in the Japanese Patent Office on Sep. 29, 2006, the entire content of which being incorporated herein by reference.

What is claimed is:

1. A power amplifier, comprising:
an amplification circuit configured to receive signals in plural frequency bands, to amplify an input signal in each frequency band through a common active element common to the signals in plural frequency bands, and to output amplified signals in plural frequency bands, the amplification circuit including
the common active element which simultaneously amplifies each of the received signals in the plural frequency bands;
an input stage matching circuit, disposed on an input side of the common active element, to match impedances across the plural frequency bands between an output impedance of a first circuit, which supplies the signals in the plural frequency bands, and an input impedance of the common active element; and
an output stage matching circuit, disposed on an output side of the common active element, to match impedances across the plural frequency bands between an input impedance of a second circuit, which receives the amplified signals in plural frequency bands outputted from the common active element, and an output impedance of the common active element.

2. The power amplifier according to claim 1, wherein:
the amplification circuit is one of a plurality of the amplification circuits including a plurality of stages arranged in a cascade arrangement, and
further comprising an interstage matching circuit for impedance-matching between an output impedance of a common active element at a former stage and an input impedance of a common active element at a latter stage, with respect to the signals in the plural frequency bands at each interstage.

3. The power amplifier according to claim 2, wherein
an amplification circuit at the latter stage includes a source grounding amplifier circuit, wherein a source is grounded through an impedance element for negative feedback having an impedance component with a predetermined magnitude, and the interstage matching circuit is common to the signals in the plural frequency bands.

4. The power amplifier according to claim 3, wherein the impedance element is an inductance element.

5. The power amplifier according to claim 4, wherein the inductance element is a bonding member connected between the source and a reference potential.

6. The power amplifier according to claim 1 or 2, wherein each of the input stage matching circuit and the output stage matching circuit is common to the signals in the plural frequency bands.

7. The power amplifier according to claim 1, further comprising:
a first path-selecting switch circuit on an input side of the power amplifier which selects signals for each band from signals in the plural frequency bands, and supplies the selected signals for each band to the amplification circuit.

8. The power amplifier according to claim 7, wherein the input stage matching circuit is provided on an input side of the first path-selecting switch circuit for each band of the signals in the plural frequency bands.

9. The power amplifier according to claim 1, further comprising:
a second path-selecting switch circuit on an output side of the power amplifier which selects signals for each band from the signals in the plural frequency bands outputted from the amplification circuit.

10. The power amplifier according to claim 9, wherein the output stage matching circuit is provided on an output side of the second path-selecting switch circuit for each band of the signals in the plural frequency bands.

11. A power amplifier, comprising:
an amplification circuit including an active element which amplifies a signal, being configured to supply signals in plural frequency bands, and for amplifying an input signal in each frequency band by the active element common to the signals in plural frequency bands, and outputting the amplified signals in plural frequency bands, the amplification circuit including the active element which amplifies each of the signals in the plural frequency bands;

an input stage matching circuit, disposed on an input side of the active element, for impedance-matching between an output impedance of a first circuit, which supplies the signals in the plural frequency bands, and an input impedance of the active element; and an output stage matching circuit, disposed on an output side of the active element, for impedance-matching between an input impedance of a second circuit, which receives the amplified signals in the plural frequency bands outputted from the active element, and an output impedance of the active element, wherein the amplification circuit is one of a plurality of the amplification circuits including a plurality of stages arranged in a cascade arrangement, and the amplification circuit further comprises an interstage matching circuit for impedance-matching between an output impedance of an active element at a former stage and an input impedance of an active element at a latter stage, across the plural frequency bands at each interstage;

a path-selecting switch circuit at a first interstage for selecting signals for each band from the signals in the plural frequency bands outputted from the amplification circuit of the former stage; and a path-selecting switch circuit at a second interstage for supplying the selected signals by the path-selecting switch circuit at the first interstage to the amplification circuit at the latter stage, wherein the interstage stage matching circuit is provided between an output side of the path-selecting switch circuit at the first interstage and an input side of the path-selecting switch circuit at the second interstage for each band of the signals in the plural frequency bands.

12. A power amplifier, comprising:

an amplification circuit including an active element which amplifies a signal, being configured to supply signals in plural frequency bands, and for amplifying an input signal in each frequency band by the active element common to the signals in plural frequency bands, and outputting the amplified signals in plural frequency bands, the amplification circuit including the active element which amplifies each of the signals in the plural frequency bands;

an input stage matching circuit, disposed on an input side of the active element, for impedance-matching between an output impedance of a first circuit, which supplies the signals in the plural frequency bands, and an input impedance of the active element; and an output stage matching circuit, disposed on an output side of the active element, for impedance-matching between an input impedance of a second circuit, which receives the amplified signals in the plural frequency bands outputted from the active element, and an output impedance of the active element;

a first path-selecting switch circuit on an input side of the power amplifier which selects signals for each band from signals in the plural frequency bands, and supplies the selected signals for each band to the amplification circuit; and an isolation circuit connected with a terminal on a side by band of the path-selecting switch circuit, wherein the isolation circuit operates a signal for passing through the corresponding terminal of the side by band when non-selected, and passes the signal to a path different from an original signal path, while the isolation circuit makes the signal for passing through the corresponding terminal of the side by band become inoperative when selected.

13. The power amplifier according to claim 12, wherein the isolation circuit includes a terminating resistor to prevent oscillation.

14. A power amplifier, comprising:

an amplification circuit including an active element which amplifies a signal, being configured to supply signals in plural frequency bands, and for amplifying an input signal in each frequency band by the active element common to the signals in plural frequency bands, and outputting the amplified signals in plural frequency bands, the amplification circuit including the active element which amplifies each of the signals in the plural frequency bands;

an input stage matching circuit, disposed on an input side of the active element, for impedance-matching between an output impedance of a first circuit, which supplies the signals in the plural frequency bands, and an input impedance of the active element; and an output stage matching circuit, disposed on an output side of the active element, for impedance-matching between an input impedance of a second circuit, which receives the amplified signals in the plural frequency bands outputted from the active element, and an output impedance of the active element;

a first path-selecting switch circuit on an input side of the power amplifier which selects signals for each band from signals in the plural frequency bands, and supplies the selected signals for each band to the amplification circuit, wherein the path-selecting switch circuit comprises a junction-type pseudomorphic high electron-mobility transistor which includes:

a half-insulation substrate of a compound semiconductor, a high-mobility electron transit layer using a hetero-junction boundary formed between a plurality of semiconductor layers stacked on the half-insulation substrate, a diffusion layer provided on one side of the plurality of semiconductor layers, and a gate formed by way of pn junction by doping impurities on the diffusion layer.

* * * * *